United States Patent
Yeh et al.

(10) Patent No.: US 9,490,234 B2
(45) Date of Patent: *Nov. 8, 2016

(54) ALTERNATIVE CURRENT LIGHT-EMITTING SYSTEMS

(75) Inventors: Wen-Yung Yeh, Hsinchu County (TW); Yu-Chen Yu, Taoyuan County (TW); Hsi-Hsuan Yen, Taipei (TW); Jui-Ying Lin, Taipei (TW)

(73) Assignee: EPISTAR CORPORATION, Hsinchu (TW)

(*) Notice: Subject to any disclaimer, the term of this patent is extended or adjusted under 35 U.S.C. 154(b) by 934 days.

This patent is subject to a terminal disclaimer.

(21) Appl. No.: 12/963,636

(22) Filed: Dec. 9, 2010

(65) Prior Publication Data

US 2011/0074305 A1    Mar. 31, 2011

Related U.S. Application Data

(63) Continuation of application No. 12/246,786, filed on Oct. 7, 2008, now Pat. No. 8,704,241, which is a continuation-in-part of application No. 11/245,255, filed on Oct. 7, 2005, now Pat. No. 7,474,681, and a continuation-in-part of application No. 11/609,538, filed on Dec. 12, 2006, now Pat. No. 8,487,321.

(30) Foreign Application Priority Data

May 13, 2005  (TW) ............................... 94115514 A
Dec. 13, 2005 (TW) ............................... 94143989 A

(51) Int. Cl.
*H01L 25/075* (2006.01)
*F21K 99/00* (2016.01)
*H01L 25/16* (2006.01)

(52) U.S. Cl.
CPC ............. *H01L 25/0753* (2013.01); *F21K 9/00* (2013.01); *H01L 25/167* (2013.01); *H01L 2924/0002* (2013.01)

(58) Field of Classification Search
CPC ............. H01L 25/0753; H01L 25/167; H01L 2924/0002; H01L 2924/00
USPC ........................................................ 315/294
See application file for complete search history.

(56) References Cited

U.S. PATENT DOCUMENTS 2,760,142 A * 8/1956 Hitchcock ........................ 363/69
3,434,678 A   3/1969 Heenan et al.
(Continued)

FOREIGN PATENT DOCUMENTS

CN  2006101656070  12/2008
DE        219086    2/1985
(Continued)

*Primary Examiner* — Xinning Niu
(74) *Attorney, Agent, or Firm* — Patterson + Sheridan, LLP

(57) ABSTRACT

A light-emitting system is introduced herein. The light-emitting system includes an insulating substrate and a plurality of light-emitting units electrically-connected on the insulating substrate. Each of the plurality of light-emitting units includes a plurality of light-emitting diodes arranged as a bridge rectifier. A first part of the plurality of light-emitting diodes emits light during positive half cycles of an AC power signal. A second part of the plurality of light-emitting diodes emits light during negative half cycles of the AC power signal. The third part of the plurality of light-emitting diodes comprising at least one light-emitting diode emits light during both the positive half cycles and the negative half cycles of the AC power signal, wherein the plurality of light-emitting units including the plurality of light-emitting diodes arranged as a bridge rectifier is formed together in a light-emitting chip.

17 Claims, 26 Drawing Sheets

(56) References Cited

U.S. PATENT DOCUMENTS

| | | | |
|---|---|---|---|
| 3,550,260 A | 12/1970 | Saltich et al. | |
| 3,582,807 A | 6/1971 | Addis | |
| 3,668,481 A | 6/1972 | Saltich et al. | |
| 4,211,955 A | 7/1980 | Ray | |
| 4,278,985 A | 7/1981 | Stobbs | |
| 4,281,448 A | 8/1981 | Barry et al. | |
| 4,301,407 A * | 11/1981 | Koslar | 324/96 |
| 4,460,863 A | 7/1984 | Conforti | |
| 4,965,457 A | 10/1990 | Wrobel et al. | |
| 5,278,432 A | 1/1994 | Ignatius et al. | |
| 5,684,309 A * | 11/1997 | McIntosh | B82Y 20/00 257/101 |
| 5,793,405 A * | 8/1998 | Shakuda | B41J 2/45 257/E27.121 |
| 5,940,683 A * | 8/1999 | Holm et al. | 438/23 |
| 6,635,902 B1 | 10/2003 | Lin | |
| 6,797,984 B1 * | 9/2004 | Lin et al. | 257/82 |
| 6,830,358 B2 | 12/2004 | Allen | |
| 6,853,150 B2 | 2/2005 | Clauberg et al. | |
| 6,897,771 B1 | 5/2005 | Lodhie et al. | |
| 6,989,807 B2 | 1/2006 | Chiang | |
| 7,025,473 B2 | 4/2006 | Dokoupil | |
| 7,221,044 B2 | 5/2007 | Fan et al. | |
| 7,276,858 B2 | 10/2007 | Allen | |
| 7,344,275 B2 | 3/2008 | Allen et al. | |
| 7,345,433 B2 | 3/2008 | Bacon et al. | |
| 7,396,142 B2 | 7/2008 | Laizure, Jr. et al. | |
| 7,474,681 B2 | 1/2009 | Lin et al. | |
| 7,482,761 B2 | 1/2009 | Yang | |
| 7,524,085 B2 | 4/2009 | Bedson et al. | |
| 7,544,524 B2 | 6/2009 | Lin et al. | |
| 7,625,099 B2 | 12/2009 | Newton et al. | |
| 7,659,544 B2 | 2/2010 | Lu et al. | |
| 7,661,852 B2 | 2/2010 | Yu | |
| 7,772,601 B2 | 8/2010 | Lee et al. | |
| 8,704,241 B2 * | 4/2014 | Yeh | H01L 25/0753 257/79 |
| 9,070,573 B2 * | 6/2015 | Yeh | H01L 25/0753 |
| 9,093,292 B2 * | 7/2015 | Yeh | H01L 25/0753 |
| 2001/0038268 A1 * | 11/2001 | Fuchsberger et al. | 315/291 |
| 2002/0139987 A1 | 10/2002 | Collins, III et al. | |
| 2004/0080941 A1 | 4/2004 | Jiang et al. | |
| 2004/0206970 A1 | 10/2004 | Martin | |
| 2004/0232454 A1 * | 11/2004 | Uemura | H01L 33/32 257/222 |
| 2004/0246696 A1 | 12/2004 | Yoo | |
| 2005/0001537 A1 | 1/2005 | West et al. | |
| 2005/0253151 A1 | 11/2005 | Sakai et al. | |
| 2005/0254243 A1 | 11/2005 | Jiang et al. | |
| 2007/0008721 A1 | 1/2007 | Peng et al. | |
| 2007/0131942 A1 | 6/2007 | Yen et al. | |
| 2007/0273299 A1 | 11/2007 | Miskin et al. | |
| 2008/0106212 A1 | 5/2008 | Yen et al. | |
| 2008/0169766 A1 | 7/2008 | Lin et al. | |
| 2008/0191632 A1 | 8/2008 | Lee | |
| 2008/0211421 A1 | 9/2008 | Lee et al. | |
| 2008/0218098 A1 | 9/2008 | Lee et al. | |
| 2008/0237613 A1 | 10/2008 | Lee et al. | |
| 2009/0096386 A1 | 4/2009 | Yeh et al. | |

FOREIGN PATENT DOCUMENTS

| | | |
|---|---|---|
| DE | 10103422 | 8/2002 |
| EP | 1469529 | 10/2004 |
| JP | 56-081959 | 7/1981 |
| JP | 62-032664 | 2/1987 |
| JP | 5198843 | 8/1993 |
| JP | 7263752 | 10/1995 |
| JP | 10256597 | 9/1998 |
| JP | 11-097747 | 4/1999 |
| JP | 2001-85738 A | 3/2001 |
| JP | 2003-305184 | 10/2003 |
| JP | 2004-333583 | 11/2004 |
| TW | 200501464 | 1/2005 |
| WO | 2004023568 | 3/2004 |
| WO | 2006030734 | 3/2006 |
| WO | 2006095949 | 9/2006 |
| WO | 2007083885 | 7/2007 |

* cited by examiner

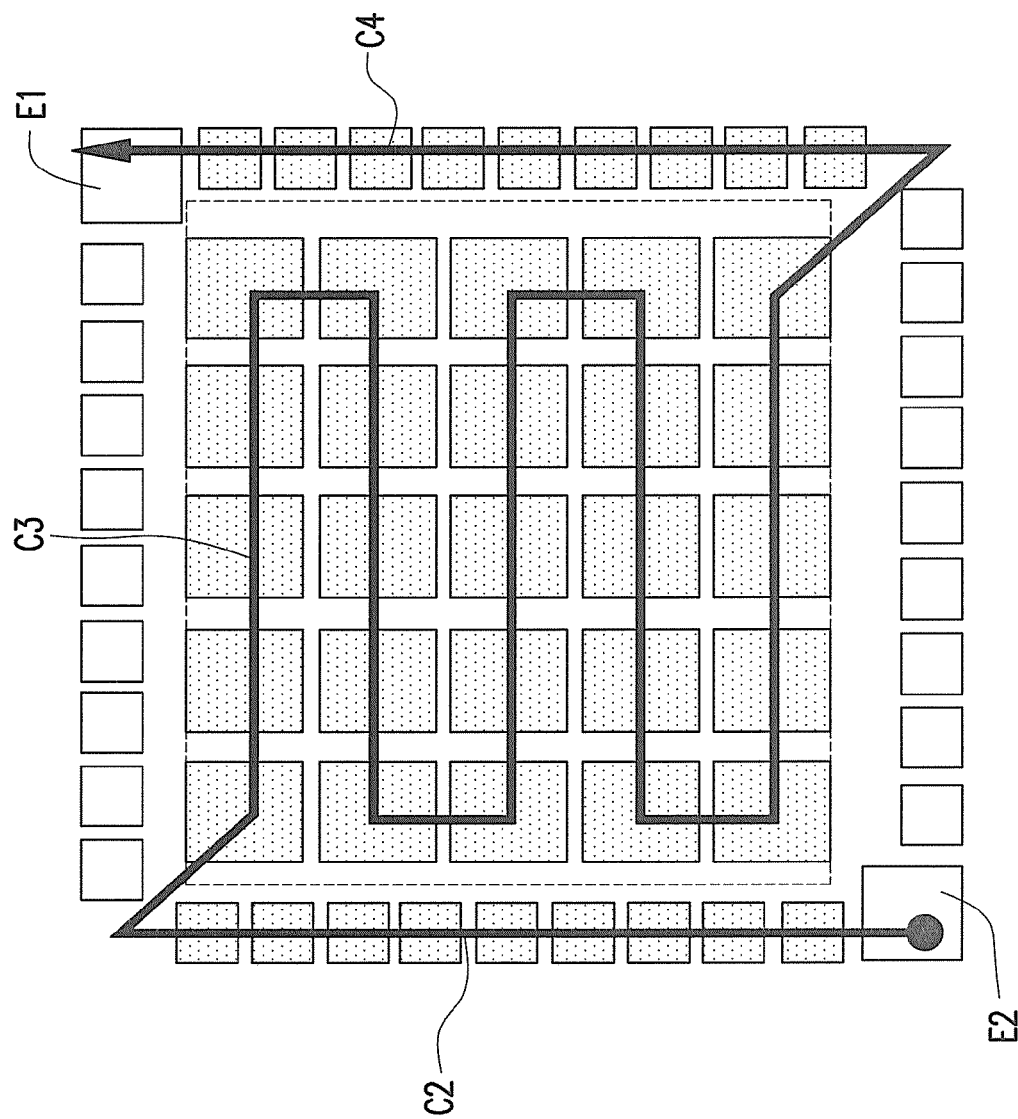

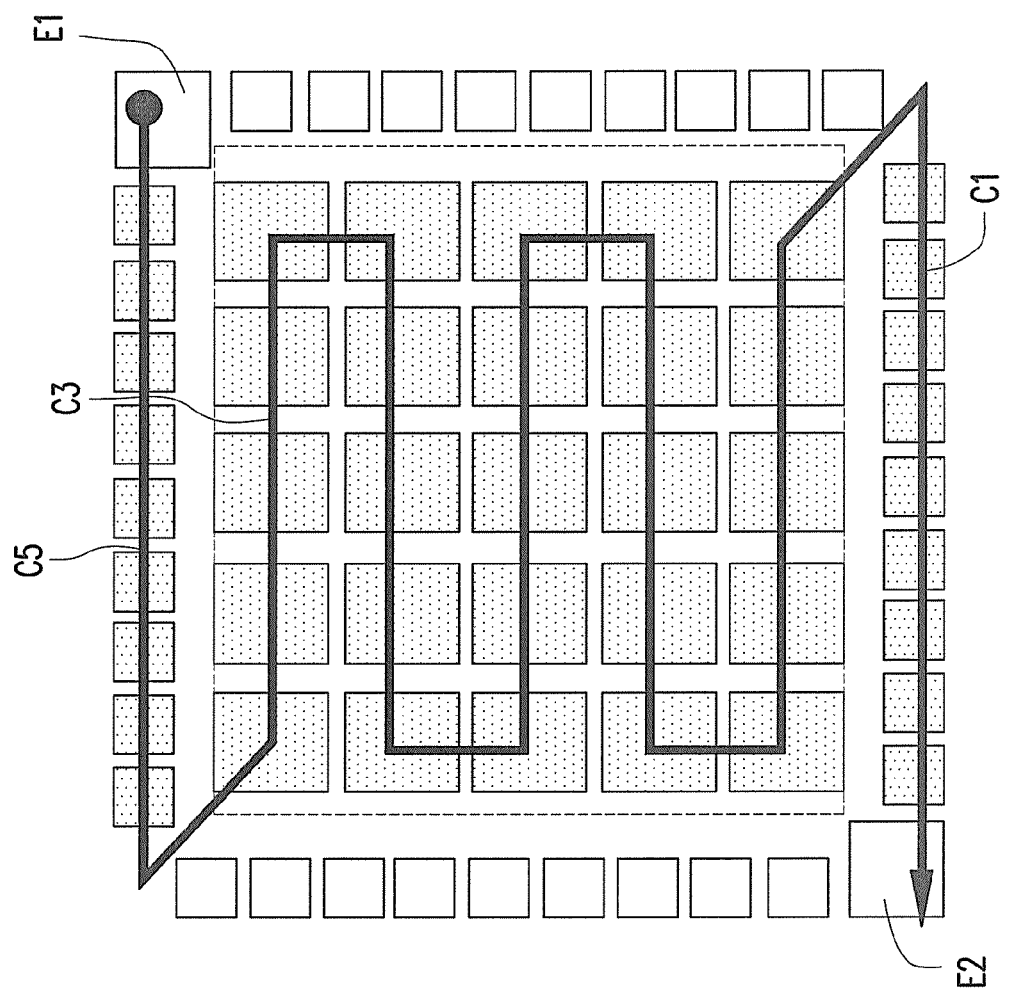

ALTERNATIVE CURRENT LIGHT-EMITTING SYSTEMS

CROSS-REFERENCE TO RELATED APPLICATION

This is a continuation application of and claims the priority benefit of patent application Ser. No. 12/246,786, filed on Oct. 7, 2008, which is a continuation-in-part application of patent application Ser. No. 11/245,255, filed on Oct. 7, 2005, which claims the priority benefit of Taiwan patent application serial no. 94115514, filed on May 13, 2005 and is now granted as U.S. Pat. No. 7,474,681. The patent application Ser. No. 12/246,786 is also a continuation-in-part application of patent application Ser. No. 11/609,538, filed on Dec. 12, 2006, which claims the priority benefit of Taiwan patent application serial no. 94143989, filed on Dec. 13, 2005, now pending. The entirety of each of the above-mentioned patent applications is hereby incorporated by reference herein and made a part of this specification.

BACKGROUND OF THE INVENTION

1. Technical Field

The disclosure relates to a light-emitting device, and more particularly, to a light-emitting device that may be operated with an alternating-current (AC) power supply.

2. Background

Light-emitting diodes (LEDs) are diodes that emit light when an electric current is supplied to the p-n junctions of the diodes. Compared to traditional bulbs, light-emitting diodes may provide one or more benefits, such as durability, longevity, portability, low power consumption, absence of harmful substances, such as mercury, etc. The application of LEDs may include typical illumination, traffic signal lights, vehicles, flash lights, back-light modules for display devices, projectors, outdoor displays, etc.

Many light-emitting systems using light-emitting devices such as light-emitting diodes are designed for DC (direct-current) applications. Therefore, it may be desirable to have light-emitting systems that may be operated with AC currents, DC currents, or currents that may flow in either direction into light-emitting systems.

SUMMARY

Several exemplary embodiments accompanied with figures are described in detail below to further describe the disclosure in details. In one of the exemplary embodiments, a light-emitting system is introduced herein. The light-emitting system comprises a substrate and a plurality of light-emitting units electrically-connected on the substrate. Each of the plurality of light-emitting units comprises a plurality of light-emitting diodes arranged as a bridge rectifier. A first part of the plurality of light-emitting diodes emits light during positive half cycles of an AC power signal. A second part of the plurality of light-emitting diodes emits light during negative half cycles of the AC power signal. The third part of the plurality of light-emitting diodes comprising at least one light-emitting diode emits light during both the positive half cycles and the negative half cycles of the AC power signal. In one of the exemplary embodiments, the substrate of the light-emitting system can be an insulating substrate. In one of the exemplary embodiments, the plurality of light-emitting units includes the plurality of light-emitting diodes of the light-emitting system arranged as a bridge rectifier is formed together in a light-emitting chip.

In one of the exemplary embodiments, a light-emitting system is introduced herein. The light-emitting system comprises a substrate and a plurality of light-emitting units formed on the substrate. Each of the plurality of light-emitting units comprising a plurality of light emitting diodes. A first part and a third part of the plurality of light-emitting units are coupled to a first current path, and a second part and the third part of the plurality of light-emitting units are coupled to a second current path, thereby the plurality of light-emitting diodes in the first part and the third part and the plurality of light-emitting diodes in the second part and the third part emit light alternatively when an AC power signal is applied to the light-emitting system. In one of the exemplary embodiments, the substrate of the light-emitting system can be an insulating substrate. In one of the exemplary embodiments, the plurality of light-emitting units includes the plurality of light-emitting diodes of the light-emitting chip.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 9A and 9B illustrate schematic diagrams of exemplary implementations of the light-emitting system illustrated in FIG. 8 or 8A, consistent with certain disclosed embodiments.

DETAILED DESCRIPTION OF DISCLOSED EMBODIMENTS

Light-emitting systems may be designed in various forms or for various applications. For example, a light-emitting system may be made on a chip or with a combination of two or more chips. A light-emitting system may be configured to generate white light or light in other colors and may be configured to accept AC power, which may drive the system to emit light during both positive and negative cycles. In other words, the system may emit light full-time or continuously from a viewer's standpoint, regardless of the direction of input currents.

Figure 1A:
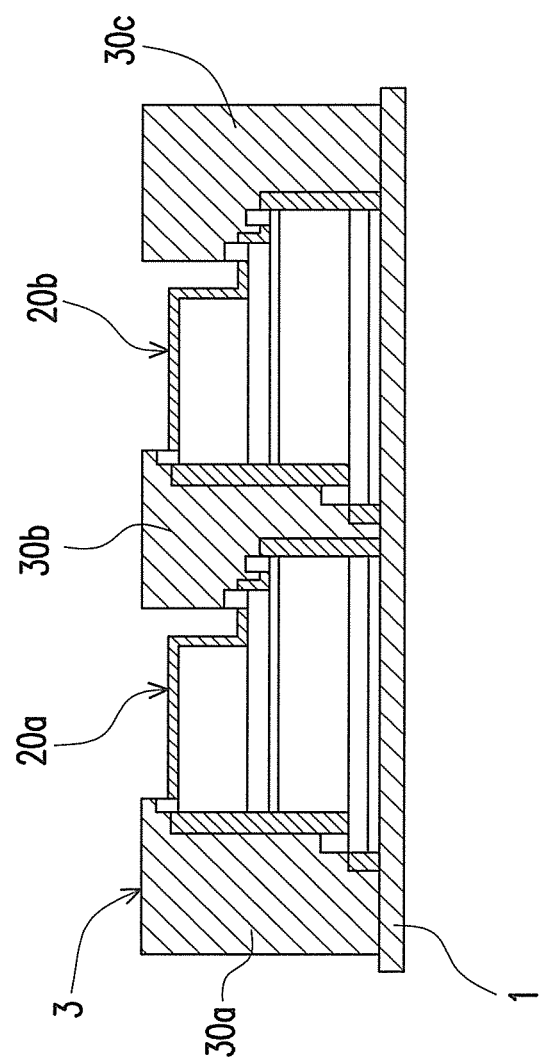
FIG. 1A is a schematic cross-sectional view of a light-emitting device, consistent with certain disclosed embodiments.

FIG. 1A is a schematic cross-sectional view of light-emitting micro diodes 20a and 20b on semiconductor substrate 1. The diodes illustrated may belong to one single AC light-emitting device in this embodiment. In one embodiment, the AC light-emitting device may include substrate 1, AC micro diode light-emitting module 2 formed on substrate 1, and conductive structure 3 having conductors 30a, 30b, and 30c for providing an electrical connection between micro diodes 20a and 20b. In one embodiment, substrate 1 can either be the base of the chip as mentioned above or an insulating substrate with a material such as Al2O3, GaAs, GaP, SiC, etc.

Figure 1B:
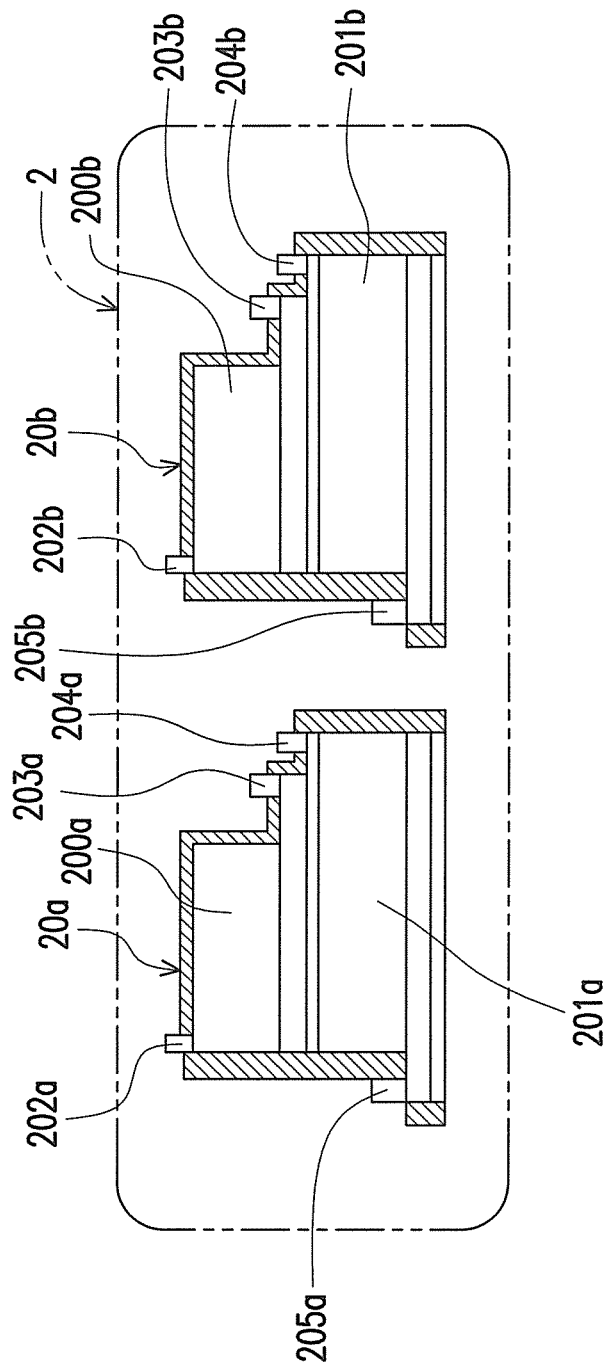
FIG. 1B is an enlarged schematic cross-sectional view of the light-emitting device illustrated in FIG. 1A, consistent with certain disclosed embodiments.

FIG. 1B is an enlarged view for illustrating light-emitting module 2 having micro diodes 20a and 20b. In one embodiment, each micro diode 20a and 20b may include one or more active layers as illustrated. For example, referring to FIG. 1B, micro diode 20a as illustrated has upper active layer 200a and lower active layer 201a. Micro diode 20b as illustrated has upper active layer 200b and lower active layer 201b as shown in the FIG. 1B. The active layers are light-emitting active layers, which may be sandwiched between two neighboring layers, such as a p layer and an n layer for each active layer. In one embodiment, those neighboring p and n layers may be coupled with corresponding electrodes, such as 202a, 202b, 203a, 203b, 204a, 204b, 205a and 205b. By applying a current to active layers 200a, 201a, 200b and 201b through electrodes 202a, 202b, 203a, 203b, 204a, 204b, 205a and 205b, the active layers may emit light.

Figure 2A:
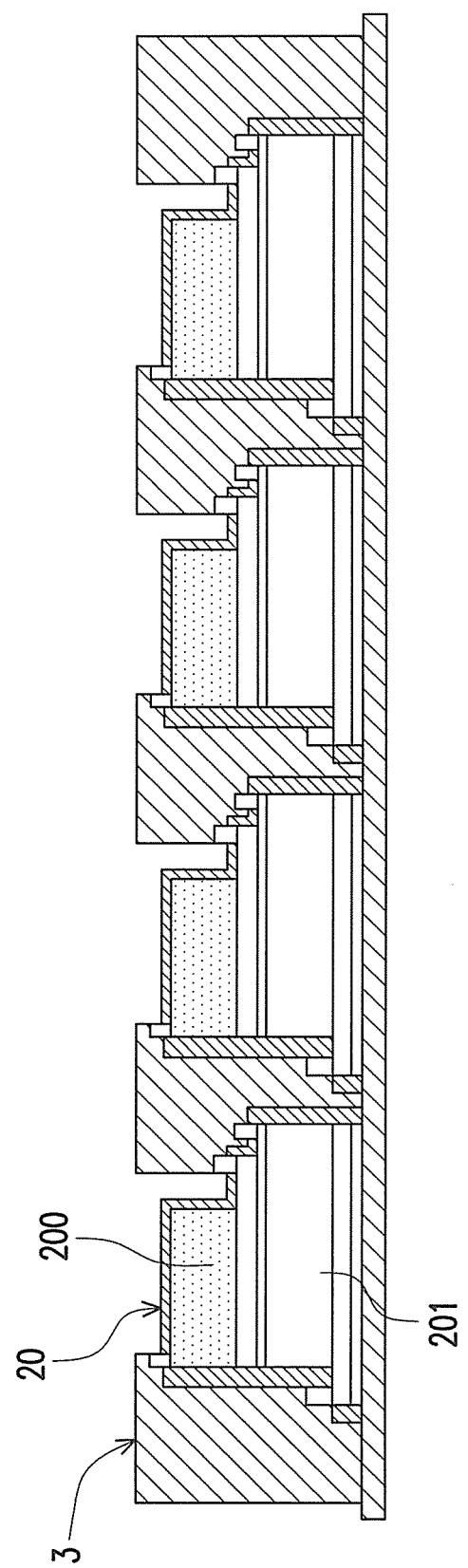
FIGS. 2A and 2B are schematic diagrams illustrating an exemplary AC light-emitting device with different emitting states, consistent with certain disclosed embodiments.
Figure 2B:
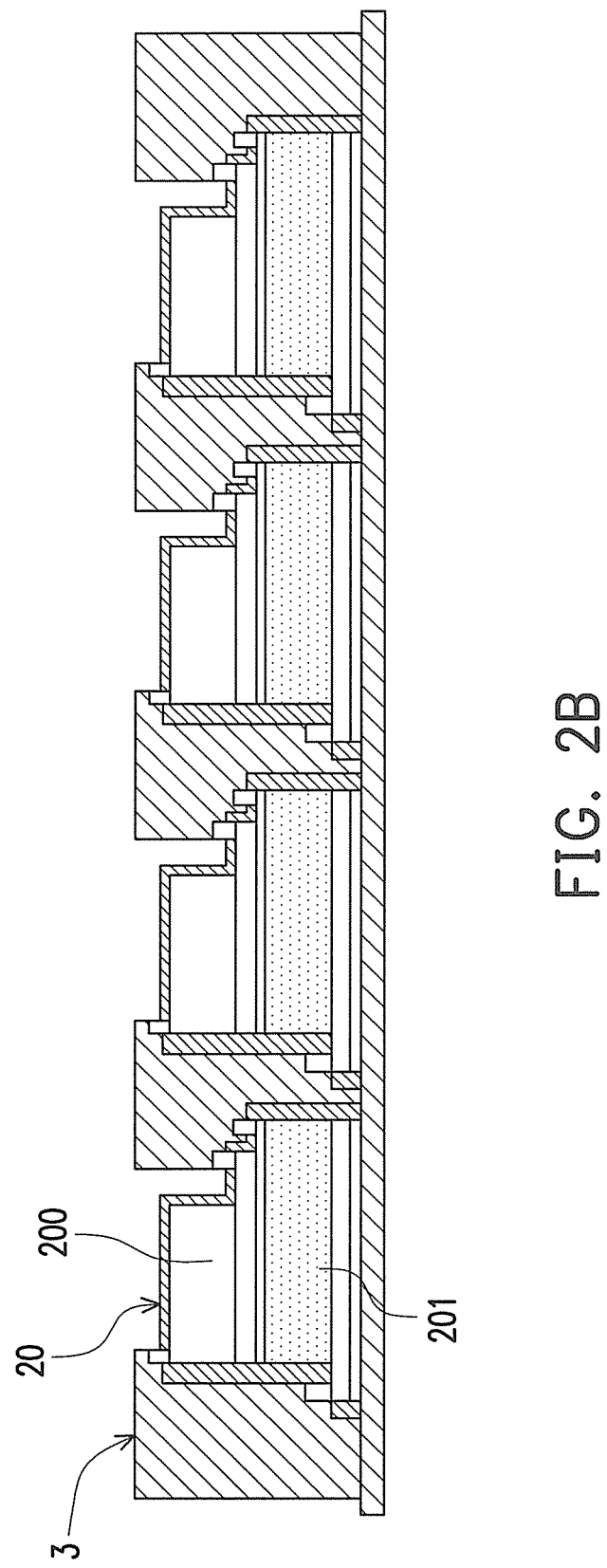
Figure 3A:
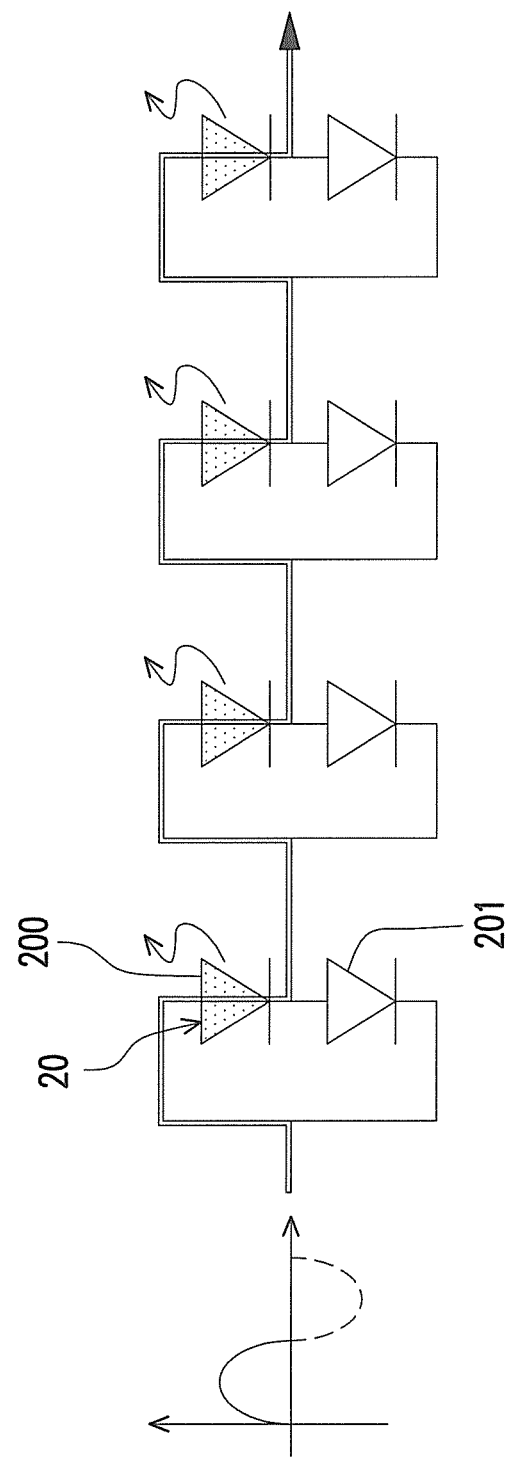
FIGS. 3A and 3B illustrate an exemplary equivalent circuitry for the device in FIGS. 2A and 2B, consistent with certain disclosed embodiments.
Figure 3B:
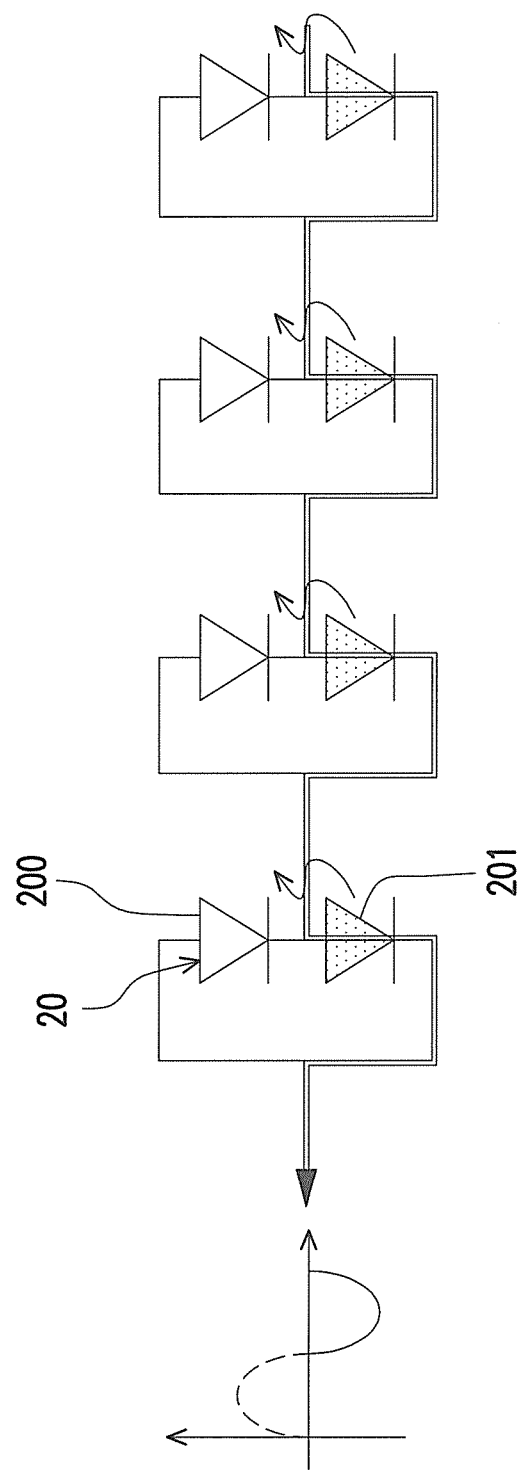

Exemplary operations of the AC light-emitting device may be illustrated with reference to FIGS. 2A, 2B, 3A and 3B. FIGS. 2A and 2B illustrate an AC light-emitting device with an AC input at two different emitting states. FIGS. 3A and 3B illustrate equivalent circuitry of the AC light-emitting device respectively corresponding to the AC light-emitting device illustrated in FIGS. 2A and 2B. Referring to FIGS. 2A and 2B, each active layer, such as upper active layer 200 and lower active layer 201, may be similar to a light-emitting diode having a p-n (i.e. p-n junction) structure. A conductive structure 3 may be formed to provide a parallel electrical connection between upper active layer 200 and lower active layer 201 of micro diode 20. All of the upper active layers may be electrically connected in series, as shown in FIGS. 3A and 3B. Similarly, all of the lower active layers may also be electrically connected in series.

With reference to FIGS. 2A and 3A, during the positive-half cycles of the AC input, the upper active layers (e.g., upper active layer 200) of the micro diodes (e.g., micro diode 20) are forward biased. As a result, a current flows through the upper active layers (e.g., upper active layer 200) of the micro diodes (e.g., micro diode 20) to allow them to emit light, as illustrated in FIG. 3A. Similarly, with reference to FIGS. 2B and 3B, during the negative-half cycles of an AC input, the lower active layers (e.g., lower active layer 201) of the micro diodes (e.g., micro diode 20) are forward biased. As a result, a current flows through the lower active layers (e.g., lower active layer 201) of the micro diodes (e.g., micro diode 20) to allow them to emit light, as illustrated in FIG. 3B. As illustrated in FIGS. 3A and 3B, the upper and lower active layers of each micro diode (e.g., upper active layer 200 and the lower active layer 201 of the micro diode 20) may be similar to two light-emitting diodes (LEDs) with oppositely-biased directions for receiving the current from either positive or negative half cycles of an AC input. The design may allow an AC light-emitting device to emit light during both the positive and negative half cycles of the AC input to the device and may enable the active layers of micro diodes to take turns in emitting light between the positive and negative half cycles of the AC input. For example, all of the upper active layers may emit light during a positive half cycle of an AC input and all of the lower active layers may emit light during a negative half cycle of the AC input.

Figure 4:
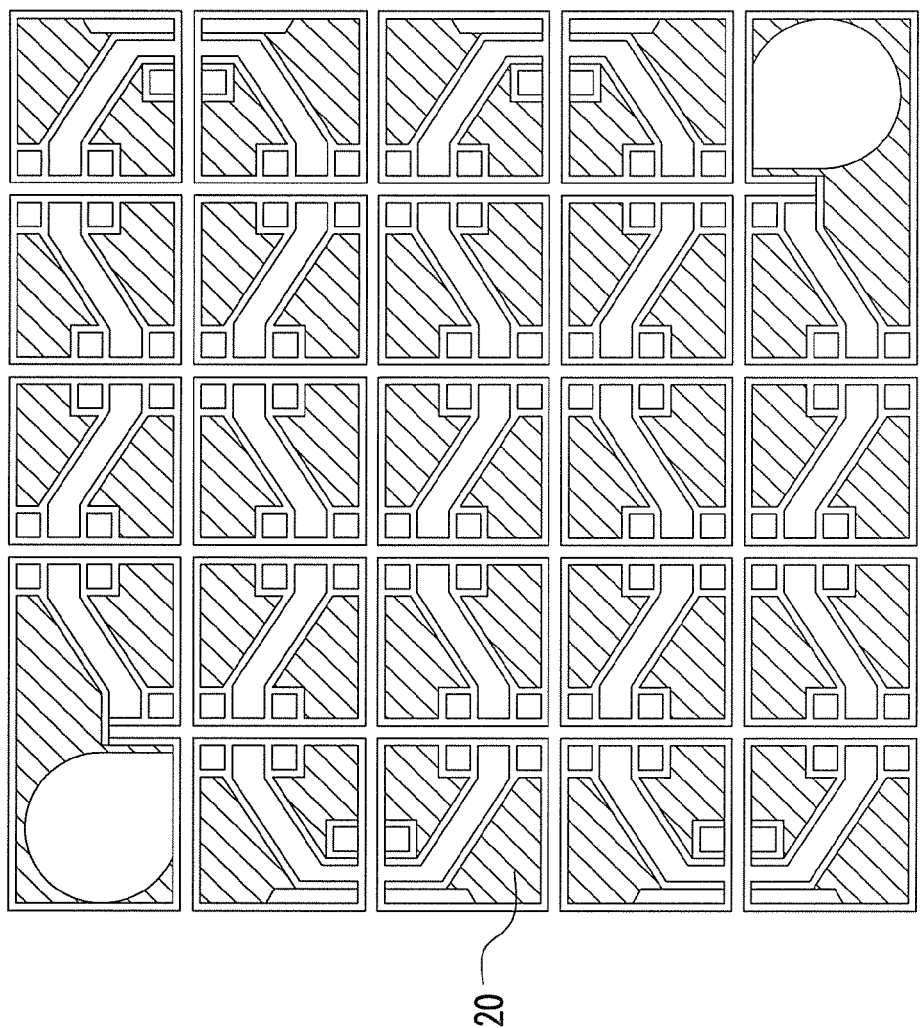
FIG. 4 is a top or bottom view diagram illustrating AC light-emitting devices on a chip, consistent with certain disclosed embodiments.

As shown in FIG. 4, when a number of micro diodes (e.g., micro diode 20) interlacing with one another are arranged on a chip and receive an AC input, the different areas or different micro diodes on the light-emitting surface of the chip may take turns emitting light, at a certain frequency, such as 60 Hz. The micro diodes may be arranged to emit light at the same or different wavelengths. That means the micro diodes may generate the same or different colors. A chip having multiple micro diodes may be configured to emit light in different colors at different timings, different areas, or different timings and areas. The various configurations can modify the chip to emit light that is the result of mixed colors, thereby offering numerous variations in colors or other visual effects. For example, micro diodes emitting light at different wavelengths may be configured as having an upper active layer emitting green light and a lower active layer emitting red light. The AC light-emitting device may generate light having a mixed color from mixing green and red lights. Specifically, if green light having a wavelength of 495 to 570 nm (for the upper active layer) is used together with red light having a wavelength 620 to 750 nm (for the lower active layer), the mixed light effect of the upper lower active layers may be similar to the white light of black body radiation. Accordingly, the disclosed device may provide an improved light-emitting device that can emit light during full cycles of an AC input. It may also provide a device that can be adjusted to selectively emit a monochromatic light or mixed colors of light according to the user's implementations, applications or requirements. Therefore, various embodiments consistent with the present invention may offer advantages over the prior art technique in some applications.

Figure 5A:
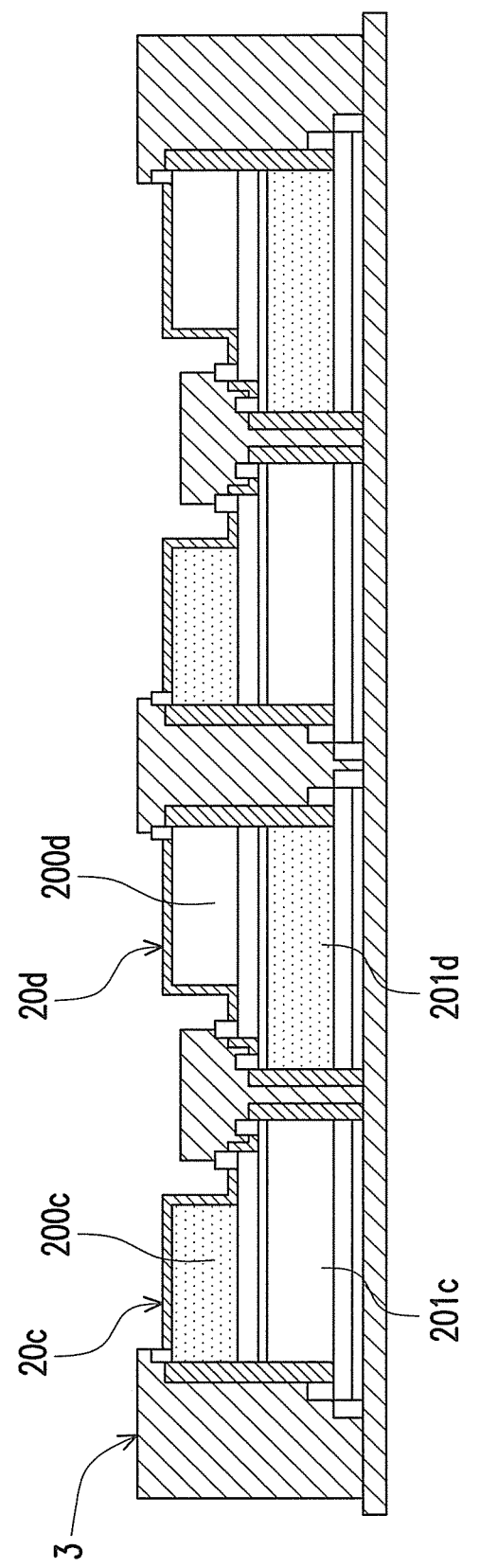
FIGS. 5A and 5B are schematic diagrams illustrating an exemplary AC light-emitting device with different emitting states, consistent with certain disclosed embodiments.
Figure 5B:
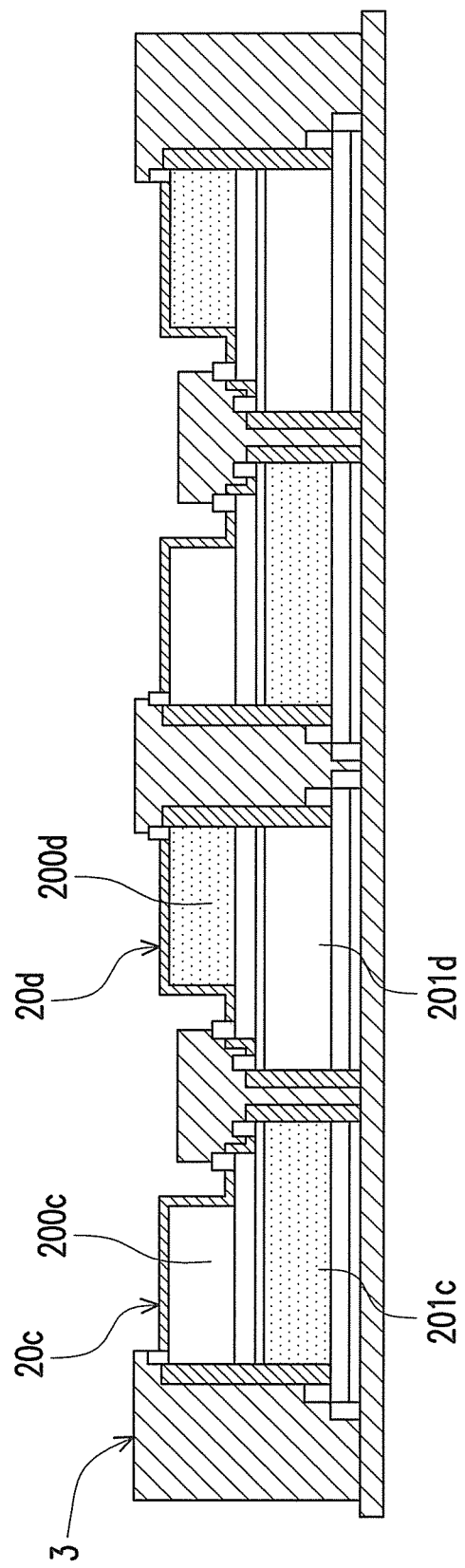
Figure 6A:
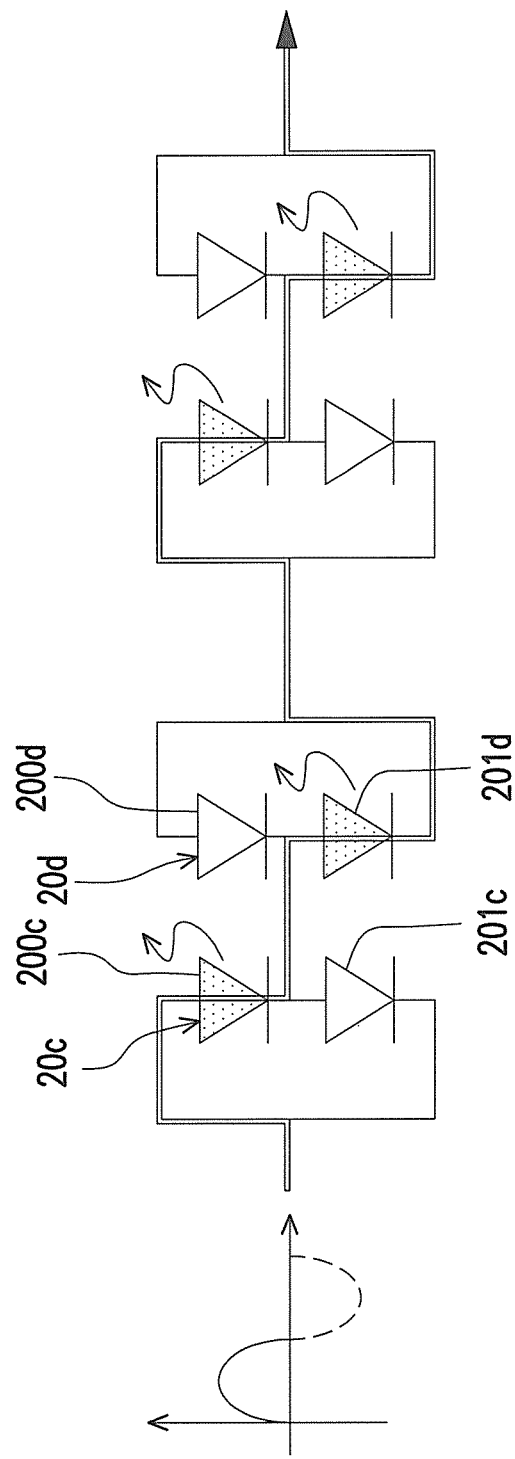
FIGS. 6A and 6B illustrate an exemplary equivalent circuitry for the device in FIGS. 5A and 5B, consistent with certain disclosed embodiments.
Figure 6B:
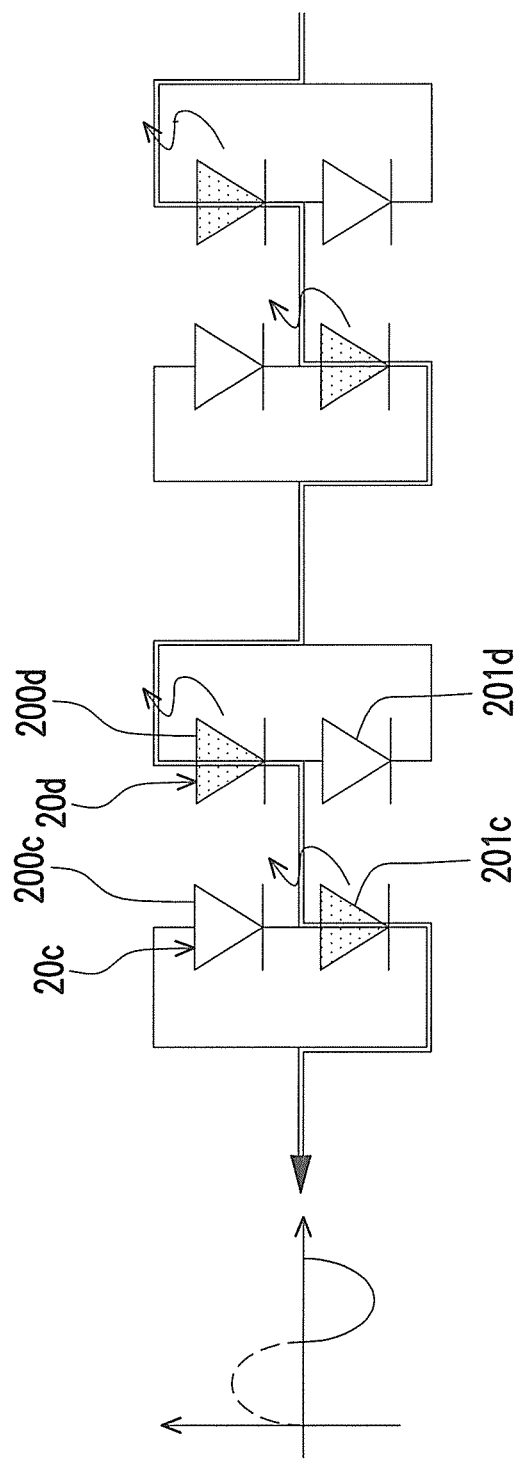

FIGS. 5A and 5B illustrate another application of the AC light-emitting device consistent with the invention, with their corresponding equivalent circuitry illustrated in FIGS. 6A and 6B. As an example, each active layer (e.g., each of upper active layers 200c, 200d and lower active layers 201c, 201d) may be similar a light-emitting diode (LED) having a p-n structure. In the illustrated structure, the upper active layers 200c and 200d and the lower active layers 201c and 201d of micro diodes 20c and 20d are coupled in parallel, and the micro diodes 20c and 20d are coupled in series through conductive structure 3.

FIG. 5A and its corresponding equivalent circuitry FIG. 6A illustrate the light-emitting status of the AC light-emitting device during the positive half cycles of an AC input. During the positive half cycles of the AC input, certain active layers of adjacent micro diodes 20c and 20d may be forward biased, such as upper active layer 200c of micro diode 20c and lower active layer 201d of micro diode 20d. Consequently, the positive half cycle of the AC input as illustrated by the arrow in FIG. 6A passes through different active layers of micro diodes 20c and 20d to activate certain different active layers, such as upper active layer 200c of micro diode 20c and lower active layer 201d of micro diode 20d, to emit light. Similarly, during the negative half cycles of the AC input as shown in FIG. 5B and its corresponding equivalent circuitry in FIG. 6B, certain active layers of adjacent micro diodes 20c and 20d may be forward biased, such as the upper active layer 200d of micro diode 20d and lower active layer 201c of micro diode 20c. The negative half cycle of the AC input, as illustrated by the arrow in FIG. 6B, passes through different active layers of micro diodes 20c and 20d to enable certain different active layers, such as upper active layer 200d of micro diode 20d and lower active layer 201c of micro diode 20c, to emit light.

As illustrated the equivalent circuitry in FIGS. 6A and 6B, the active layers in each micro diode, such as upper active layer 200c and lower active layer 201c in micro diode 20c, may be similar to two light-emitting diodes stacked together. The embodiment differs from the embodiment depicted in FIGS. 2A, 2B, 3A and 3B in that the different active layers of micro diodes 20c and 20d take turns emitting light during the positive or negative half cycles of the AC input. A number of micro diodes may be arranged in an interlacing manner on a chip to be driven by an AC power input, so that the light-emitting surface of the chip may emit light at both positive and negative cycles regardless of the direction of an input current.

Similarly, micro diodes 20c and 20d as described above may emit light with the same or different wavelengths to display the same or different colors. In other words, the micro diodes emitting different colors may be configured in numerous ways, such as with variations in emitting timing, region, or both, to generate desired color or visual effects.

Additionally, upper active layers 200c and 200d and lower active layers 201c and 201d may emit light of different colors at a higher frequency, such as 120 Hz (2 times of 60 Hz). For a frequency exceeding highest human-recognizable frequency of 100 Hz, a more even or soft visual effect of mixing light or colors may be provided. Accordingly, the light-emitting device employed in this embodiment may comply with users' needs to flexibly adjust colors of emitting light and may produce more even or soft visual effects.

Figure 7:
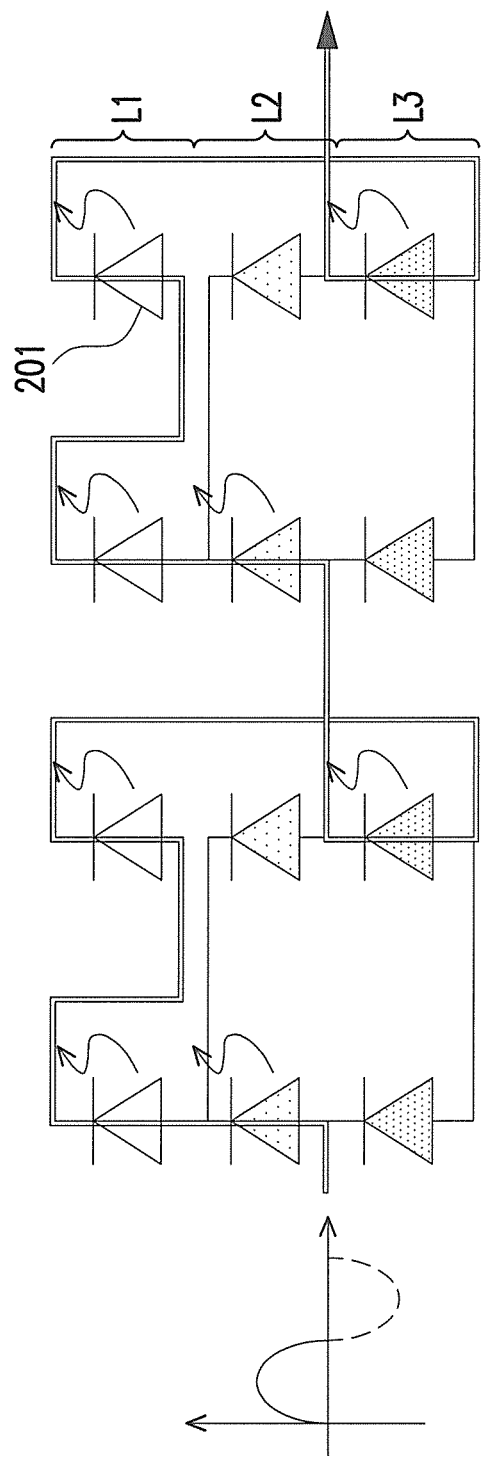
FIG. 7 is an exemplary equivalent circuitry for a tri-layer, AC light-emitting device, consistent with certain disclosed embodiments.

FIG. 7 illustrates an exemplary equivalent circuitry of an AC light-emitting device with micro diodes having three active layers. When applying a positive half-cycle of an AC input as shown by the arrows, each active layer along the current path will emit light. The same occurs to the active layers that are part of the current path for the current from a negative half-cycle of an AC input. In one embodiment, the three-layer structure is implemented by having a first layer L1 emit green light, a second layer L2 emit blue light, and a third layer L3 emit red light. Green, blue and red lights are three primaries that can be combined to produce white light.

Referring to FIG. 7, the colors produced during the positive half-cycles of an AC input may appear in the order (following the arrow from left to right) of blue, green, green, red, blue, green, green, red. The colors produced during the negative half cycles of the AC input may also appear in the same order of blue, green, green, red, blue, green, green, red, but the current flows from right to left to activate the other two blue and two red diodes. Those diodes do not activate during the positive half-cycle, but the green diodes do activate and emit light during both the negative and positive half-cycles. The exemplary configuration is based on the fact that the human eye needs more green in order to perceive white. In this embodiment, the AC light-emitting device can be configured to employ and match different colors to achieve an overall desired color effect. As an example, for a three-layer structure to have an effect of producing white light, one may mix green light at a 535 nm wavelength, blue light at a 460 nm wavelength, and red light at a 630 nm wavelength. When three or more active layers are used to mix light, color temperature may be adjusted. In some examples, one or more active layers can be made non-luminous to vary the light mixing for various applications or requirements.

Figure 8:
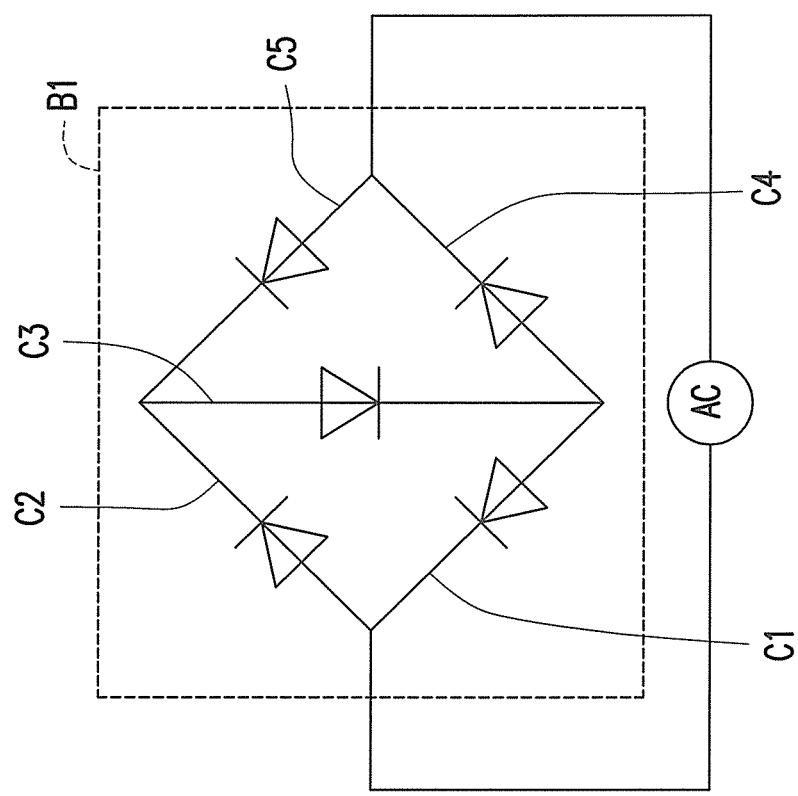
FIG. 8 illustrates an exemplary circuit diagram of a light-emitting system, consistent with certain disclosed embodiments.

Referring to FIG. 8, micro diodes can be configured in a bridge rectifier configuration. Each micro diodes in the bridge rectifier configuration may have one or more active layers. Each active layer, which is similar to a light emitting diode as discussed above, may be electrically connected. In one embodiment, a light-mixing system may mix colors from multiple diodes or layers.

Also, as illustrated in FIG. 8, the light-emitting system may have first circuit C1, second circuit C2, third circuit C3, fourth circuit C4 and fifth circuit C5. The colors of the emitted light and the number of active layers (light emitting diodes) may be varied by users depending on their requirements or application. In one embodiment, 10 active layers may be placed in one or more of first circuit C1, second circuit C2, fourth circuit C4, and fifth circuit C5, and 22 active layers may be placed in circuit C3. In this circuit structure arrangement, the number of the active layers required to sustain a reverse-biased voltage is about half the number of active layers to conduct a forward-biased voltage. Therefore, the total number of active layers (light emitting diodes) required to be used in this light emitting system may be reduced. Therefore, if a structure has a plurality of active layers that are subject to a reverse-biased voltage from an AC input, the reverse-biased voltage may be evenly absorbed or distributed to prevent shorting or break-down caused by excessive reverse-biased voltage. In one embodiment, one active layer can sustain about 10-15 volts of reverse-biased voltage.

The configuration of second circuit C2, third circuit C3 and fourth circuit C4 may be the path for the positive half cycle of an AC input illustrated in FIG. 9A, and the configuration of fifth circuit C5, third circuit C3 and first circuit C1 may be the path for the negative half cycle of an AC as illustrated in FIG. 9B. The configuration in one embodiment allows third circuit C3 to be a current path for both the positive and negative half cycles of an AC input. This may provide the effect of continuous light emitting to viewers. The conductive electrodes or terminals E1 and E2 may be connected with an AC input to provide the input to circuits C1-C5.

In one embodiment, because the active layers of the third circuit C3 can emit light during either the positive or negative half cycles of alternating current, the number of active layers used in other implementations, which only emit light half of the time, can be reduced. For example, the number of active layers used in other techniques may requires 22 layers for each of the positive and the negative half cycles of alternating current, making a total number of 44. In contrast, the embodiment only employs a total number of 22 active layers in third circuit C3 (or rectifying device RD5 in FIG. 8A) to achieve the effect of full-timely continuous light emitting.

Figure 10A:
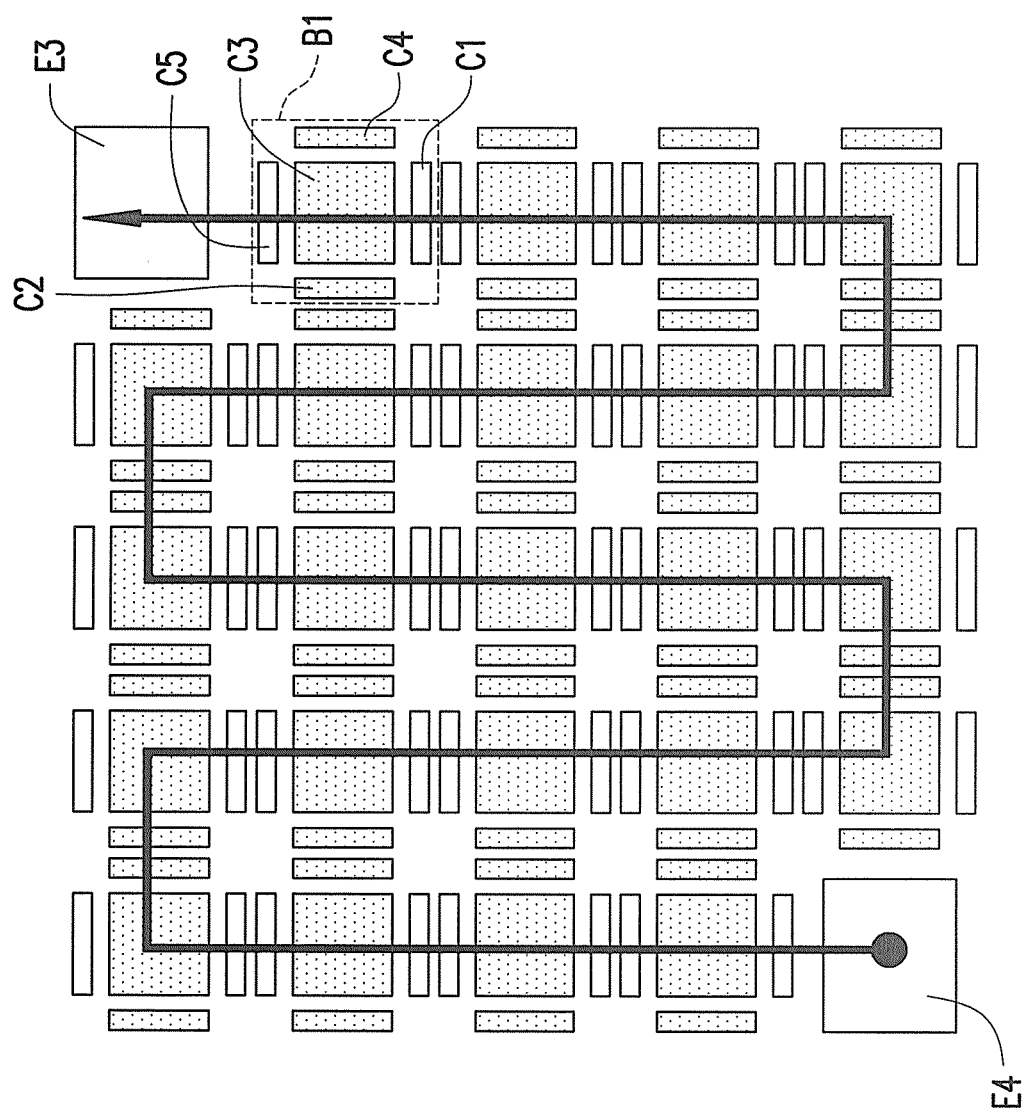
FIGS. 10A and 10B illustrate schematic diagrams of exemplary implementations of the light-emitting system illustrated in FIG. 8 or 8A, consistent with certain disclosed embodiments.
Figure 10B:
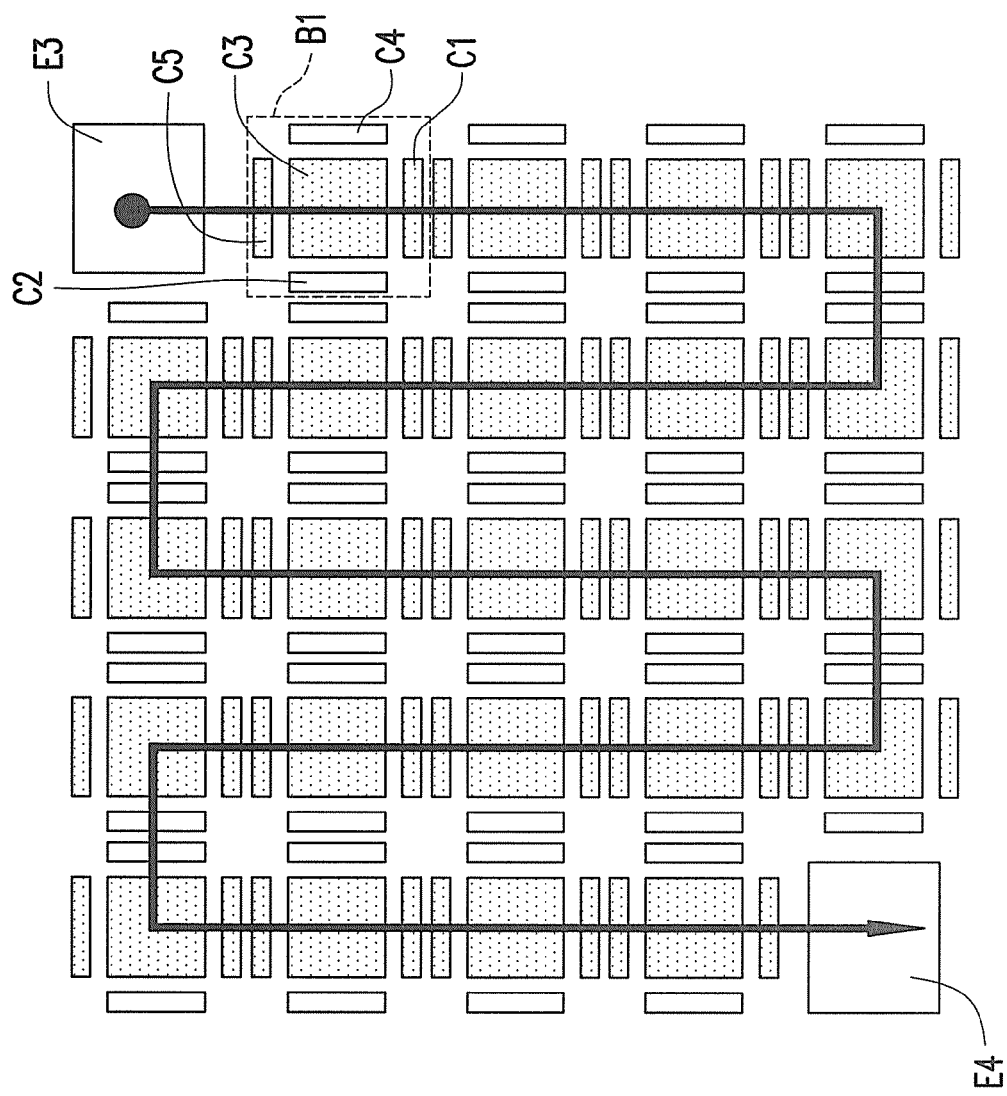
Figure 15A:
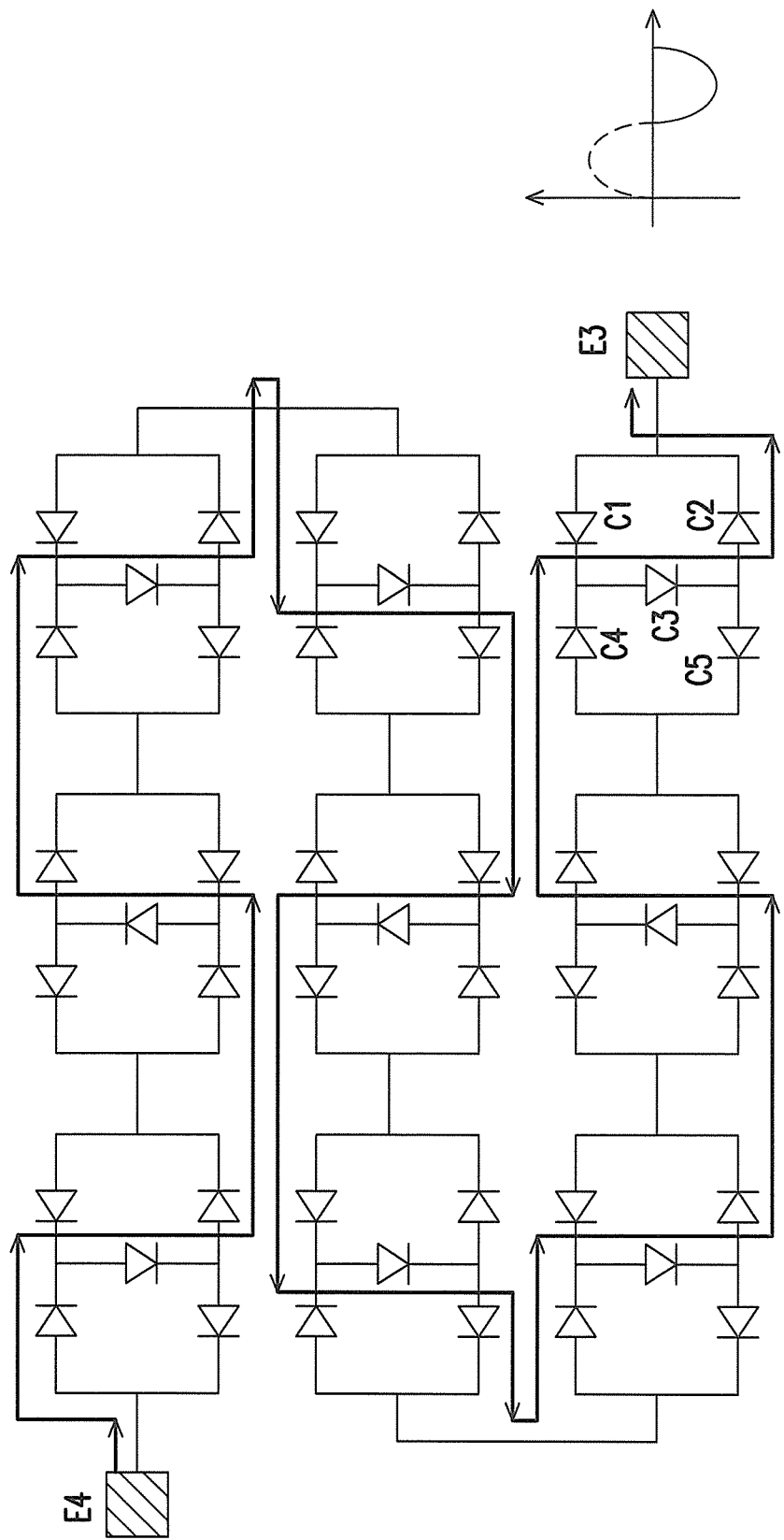
FIG. 15A and FIG. 15B are the equivalent circuitries of FIG. 10A and FIG. 10B correspondingly.
Figure 15B:
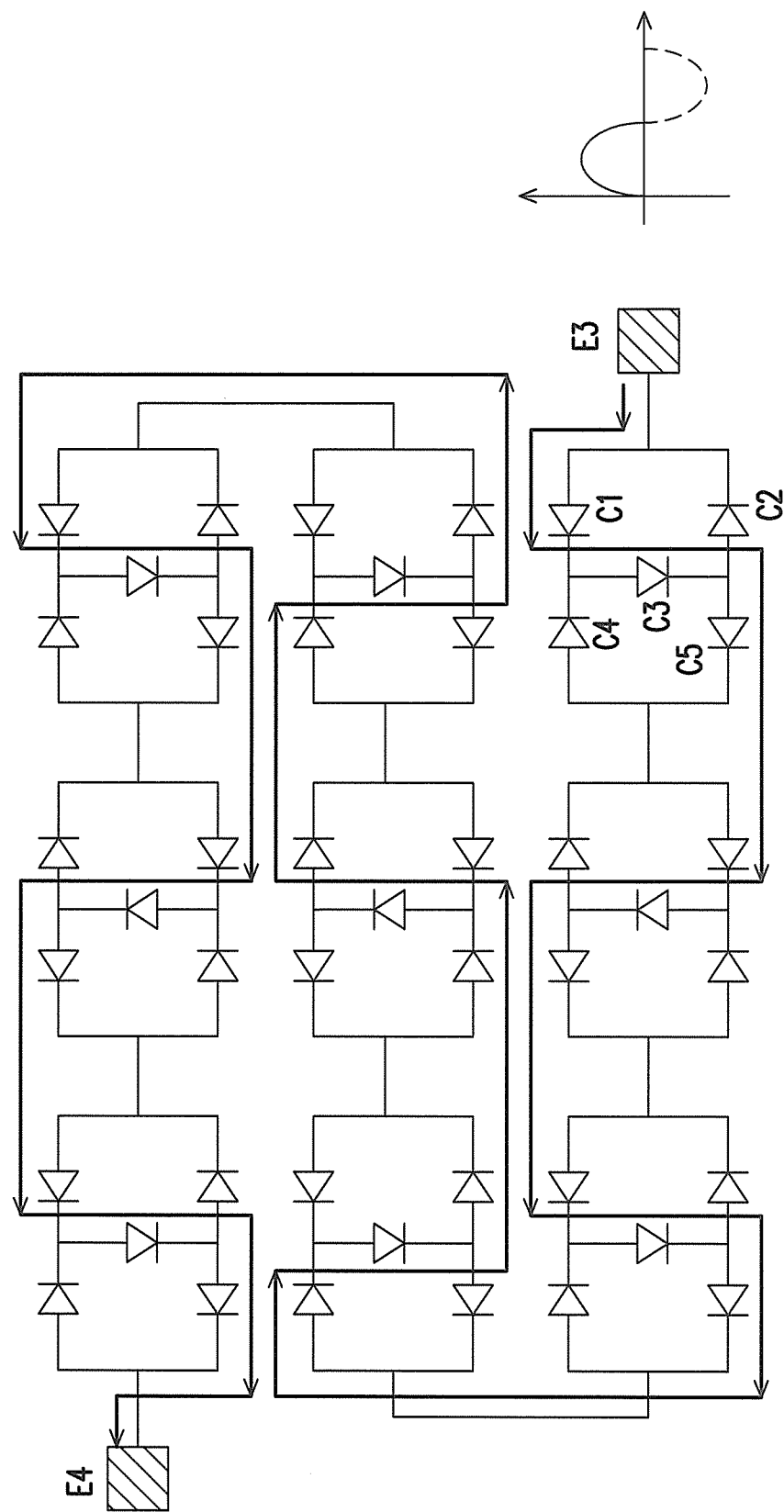

In some embodiments consistent with the present invention, active layers (or micro diodes) may be arranged as a bridge light-emitting system illustrated in FIG. 8. The system may be constituted by micro diodes having multiple active layers arranged as a bridge rectifier as illustrated. Multiple bridge rectifiers may be electrically coupled to each other provide a larger light-emitting system. For example, a plurality of bridge rectifiers or bridge light-emitting units may be arranged in a matrix and in a chip as illustrated in FIGS. 10A and 10B, the equivalent circuitries of which are shown in FIGS. 15A and 15B correspondingly. In one example, the number of active layers in the bridge light-emitting units 800 may be greater in the central region than that in the peripheral region. At the two diagonal corners of the matrix, two conductive electrodes E3 and E4 may be provided for connecting the system with an AC input.

The circuit configuration as described above can also be applied to an alternating current light emitting device composed of micro diodes, wherein each micro diode has a single active layer, such as forming one or more bridge rectifiers or bridge light emitting units composed of a plurality of light emitting micro diodes on a substrate, micro diodes being arranged in a bridge rectifier configuration and being electrically connected to each other through a conductive structure, thereby making the micro diodes to take turns to emit light during the positive and negative half cycles of alternating current. Alternatively, it can include a plurality of bridge light emitting units electrically connected to one another, each bridge light emitting unit being disposed as a part of a matrix, wherein the number of the bridge light emitting units is greater in the central region than in the peripheral region to thereby achieve a full-timely and more even light emitting effect. Additionally, it further includes a step of disposing two conductive electrodes E3 and E4 on the two diagonal corners of the matrix, each conductive electrode E3 and E4 being serially connected to each bridge light emitting unit to provide a connection of to alternating current.

In another embodiment consistent with the present invention, the light-emitting device may include a mounting body or be combined with a mounting substrate. For example, the conductive structure may be formed separately from the light-emitting units on the mounting substrate. Alternatively, the mounting substrate can include a plurality of light-emitting units electrically connected to one another by the conductive structure on the mounting substrate, each light-emitting unit disposed as a part of a matrix to thereby achieve a full-time and even light-emitting effect. Additionally, it may include a step of disposing two conductive electrodes on the two diagonal corners of the matrix, each conductive electrode serially connected to each bridge light-emitting unit (e.g., light-emitting unit 800) to provide a connection to an AC input.

Figure 11A:
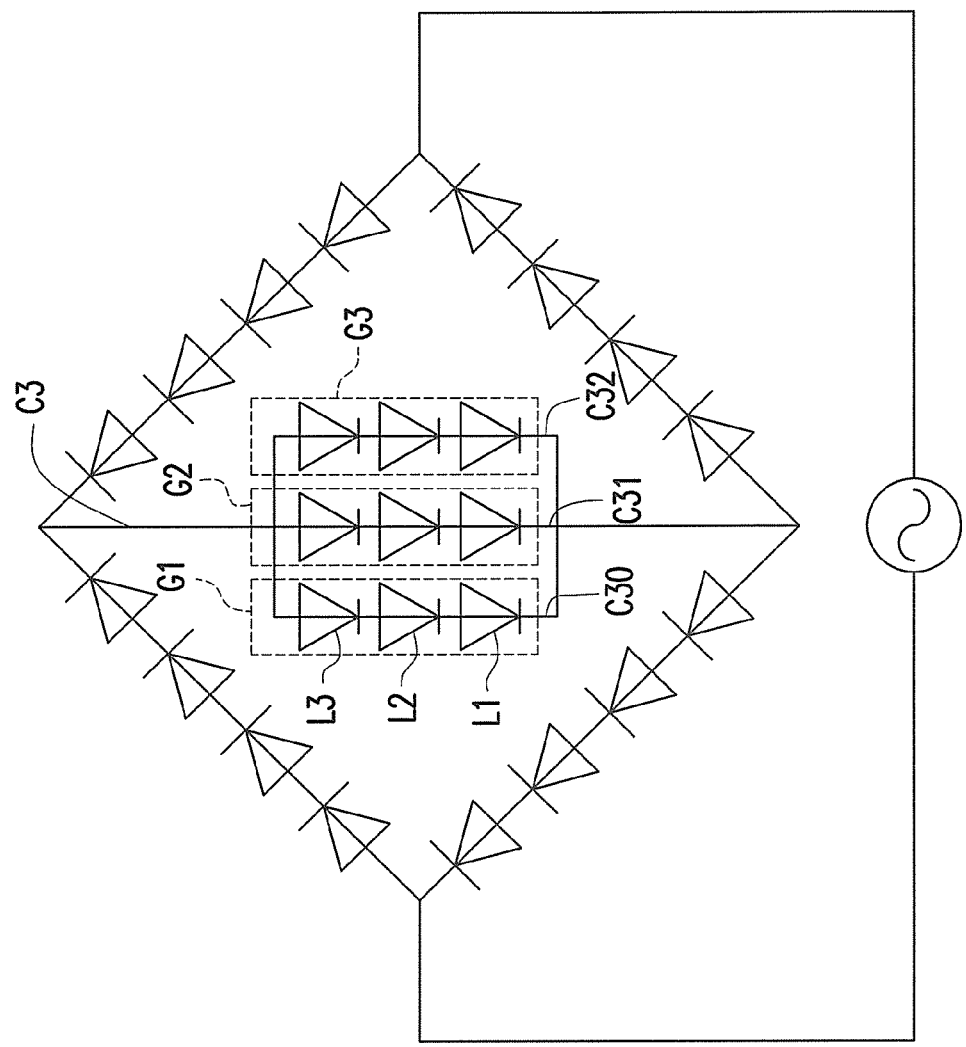
FIG. 11A illustrates an exemplary circuit diagram of a light-emitting system, consistent with certain disclosed embodiments.

The visual effect of mixing light may be provided by disposing a plurality of light-emitting micro diodes on circuit C3 or other circuits, in a parallel or serial connection or a combination of both types of connections. As shown in FIG. 11A, three groups of light-emitting micro diodes are electrically connected in parallel. For example, the light-emitting micro diodes of groups G1, G2 and G3 may be arranged on circuits C30, C31 and C32 respectively. The light-emitting micro diodes of each group may be electrically connected in series as illustrated, in parallel, or in both types of arrangements. In an exemplary embodiment, the light-emitting micro diodes of each group may have the same wavelengths in emitting light. For example, referring to FIG. 11A, light-emitting micro diodes L1, L2 and L3 each may have one active layer. Each active layer may emit light at the same wavelength. Alternatively, each active layer may emit light at different wavelengths. The light-emitting micro diodes from different groups may emit light at different wavelengths. For example, Group G1 may emit green light, group G2 may emit blue light, and group G3 may emit red light. In one embodiment, the mixing light may be controlled by adjusting the operating voltages.

Figure 11B:
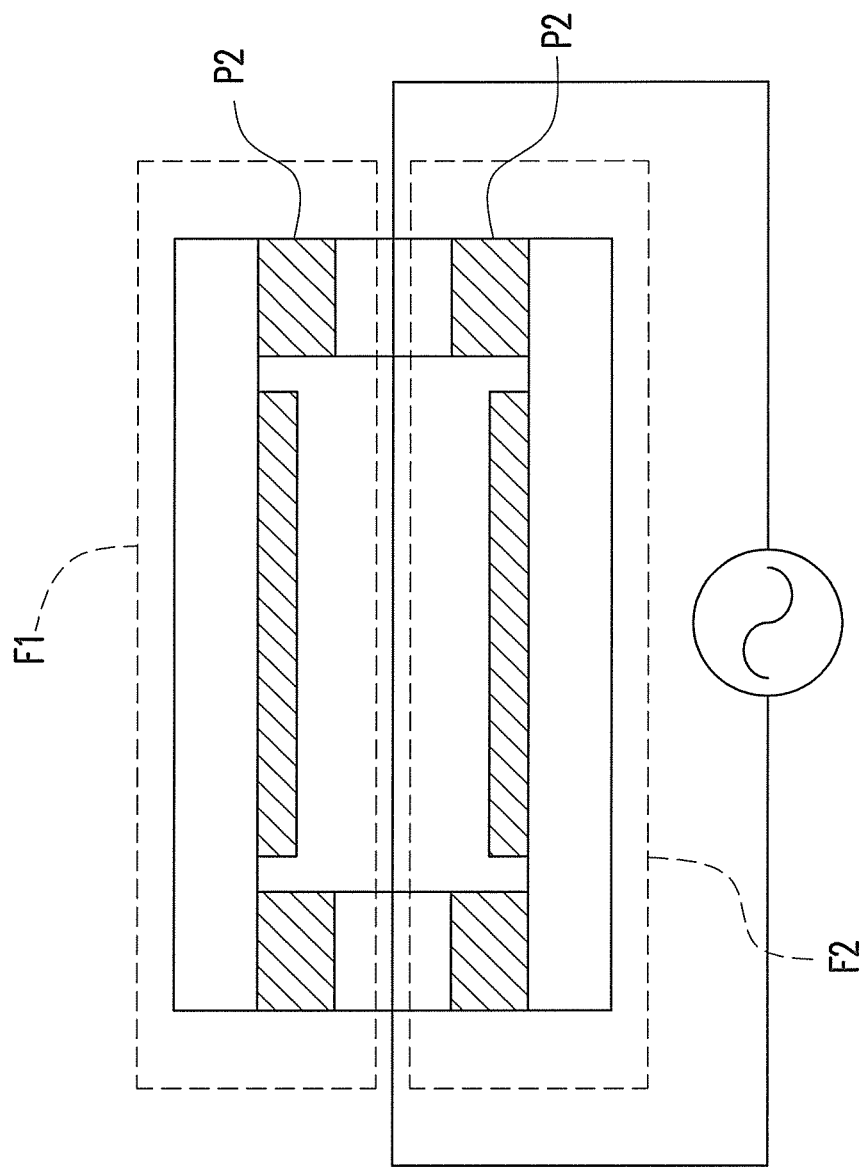
FIG. 11B illustrates an example of a flip-chip light-emitting system coupled to an AC input, consistent with certain disclosed embodiments.

In one embodiment consistent with the present invention, as shown in FIG. 11B, a first micro diode F1 having one active layer may emit red light. A second micro diode F2 having one active layer may emit green light. The first and second micro diodes combined with a flip-chip or wafer bonding technique and may be electrically connected through conductive electrodes P1 and P2 thus providing a visual effect of mixing light.

Figure 11C:
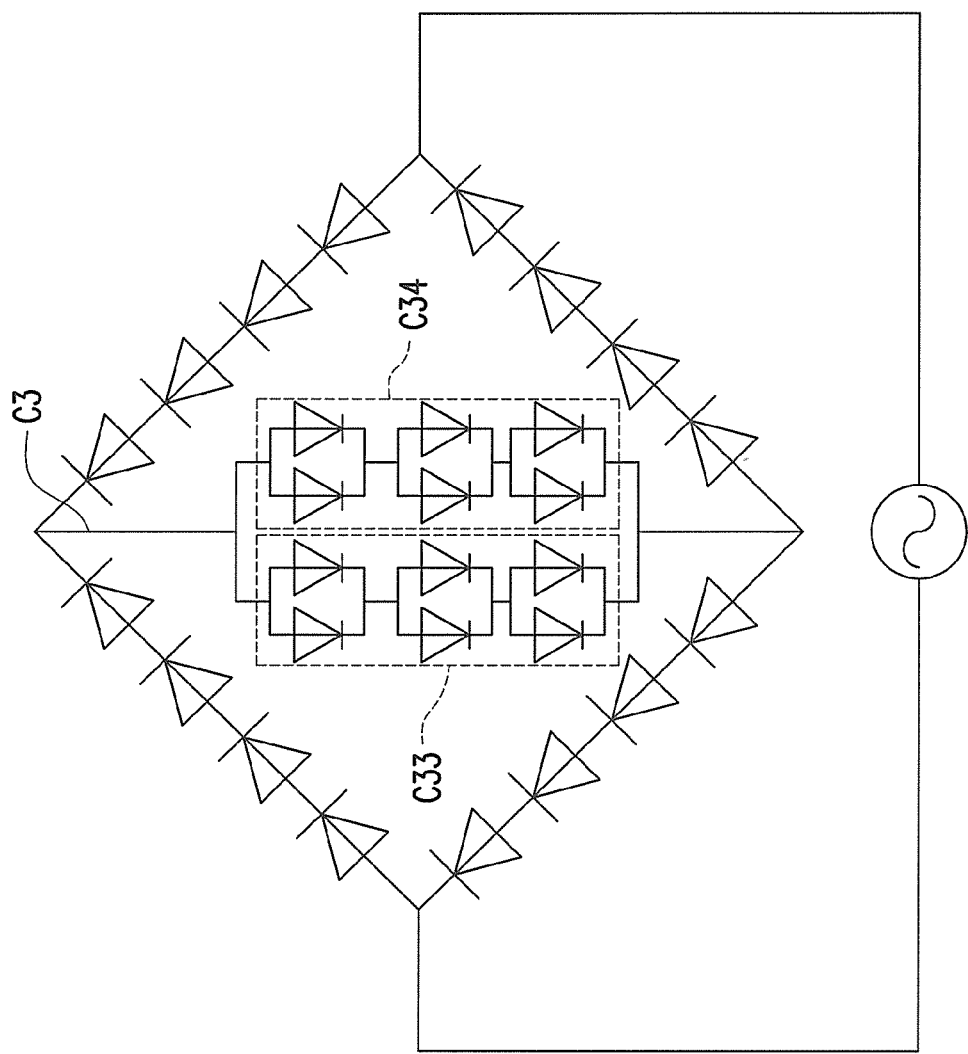
FIG. 11C illustrates an exemplary circuit diagram of a light-emitting system, consistent with certain disclosed embodiments.

In another embodiment consistent with the present invention, each light-emitting micro diode on circuit C3 may have two or more active layers as shown in FIG. 11C. The active layers of each light-emitting micro diode may emit light having the same or different wavelengths. A plurality of light-emitting micro diodes may be serially and electrically connected on circuits C33 and C34 respectively. Light-emitting micro diodes in circuits C33 and C34 may be electrically connected in parallel. Accordingly, the visual effect of emitting mixed light is achieved. The number of active layers, the number of micro diodes, and variations in serial and parallel connections of the active layers and micro diodes may be implemented in either circuits C1-C5 in FIG. 8 or rectifying devices RD1-RD5 in FIG. 8A. The variations, in combination with the variations in the light-emitting colors of the diodes, may be varied to accommodate different applications, different operational voltages, different visual or color effects, and other characteristics desired under different circumstances.

The active layers (or LEDs) may be implemented in switch circuits, signalling circuits, or other circuits without adding external load. A plurality of active layers may be configured in a parallel connection, a serial connection, or both for various lighting applications. Moreover, the devices or systems disclosed in various embodiments may be implemented in LCD (liquid crystal display) backlight devices, such as example illustrated in U.S. Publication Numbers 20050001537, 20040246696, and 20040333583. The active layers can also be implemented with a variety of manufacturing processes, such as the 5.phi.) LED conducting wire stand glue-irrigating packaging process; the Super Flux conducting wire stand glue-irrigating packaging process; the Flip-Chip, ceramics and aluminium substrate manufacturing processes; the PPA point-gluing, injection packaging process; the metal shell packaging process, etc.

Figure 8A:
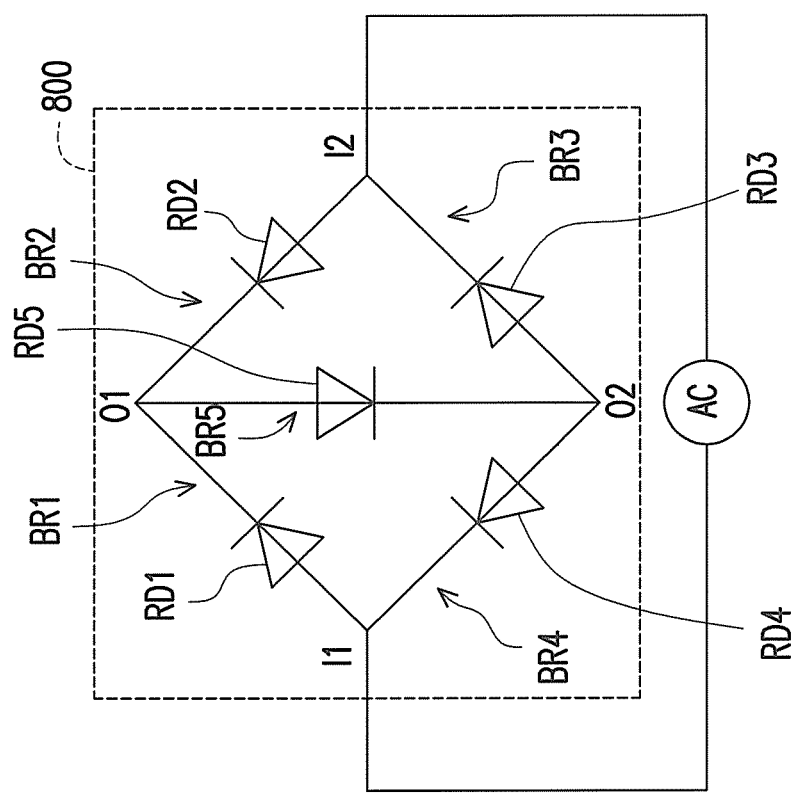
FIG. 8A illustrates an exemplary circuit diagram of a light-emitting system, consistent with certain disclosed embodiments.

FIG. 8A, a drawing similar to FIG. 8 discussed below but with different element designations. Referring to FIG. 8A, the light-emitting unit 800 may include first power input terminal I1 and second power input terminal I2 for receiving an external power input, which may be an AC power input as illustrated, a DC input, or a mixture of both. the light-emitting unit 800 may also include five rectifying devices RD1 through RD5. First rectifying device RD1 may be coupled between first power input terminal I1 and first intermediate contact O1. First rectifying device RD1 may be configured to allow a current flow from first power input terminal I1 to first intermediate contact O1. The second rectifying device RD2 may be coupled between second power input terminal I2 and first intermediate contact O1. Second rectifying device RD2 may be configured to allow a current flow from second power input terminal I2 to first intermediate contact O1. Third rectifying device RD3 may be coupled between second intermediate contact O2 and second power input terminal I2. Third rectifying device RD3 may be configured to allow a current flow from second intermediate contact O2 to second power input terminal I2. Fourth rectifying device RD4 may be coupled between second intermediate contact O2 and first power input terminal I1. Fourth rectifying device RD4 may be configured to allow a current flow from second intermediate contact O2 to first power input terminal I1. Fifth rectifying device RD5 may be coupled between first intermediate contact O1 and second intermediate contact O2, and may be configured to allow a current flow from first intermediate contact O1 to second intermediate contact O2 and to emit light in response to the current.

As shown in FIG. 8A, the four rectifying devices RD1-RD4 may be arranged in a bridge rectifier circuit. When an alternating-current (AC) input is received from power input terminals I1 and I2, the AC input current may flow through RD1, RD5, and RD3 in one half cycle (of positive polarity) and may flow through RD2, RD5, and RD4 in the other half cycle (of negative polarity). As an example, a first input current flowing from first power input terminal I1 to second power input terminal I2 may flow through first, fifth, and third rectifying devices RD1, RD5, and RD3. A second input current flowing from second power input terminal I2 to first power input terminal I1 may flow through second, fifth, and fourth rectifying devices RD2, RD5, and RD4 allowing the light-emitting unit 800 to emit light in response to both the first and second input currents.

In one embodiment, the fifth rectifying device may include one or more light-emitting micro diodes. In other words, the bridge rectifier circuit may function to rectify the AC input into a direct current going through RD5, so that the current may flow through the light-emitting micro diode(s) and allow the light-emitting micro diode(s) in RD5 to emit light during both positive and negative cycles of the AC input.

In one embodiment, one or more of first, second, third, and fourth rectifying devices RD1-RD4 may include one or more light-emitting micro diodes each having one or more active layers. In some embodiments, fifth rectifying device RD5 may include two or more light-emitting micro diodes coupled in series, parallel, or in a combination thereof. In some examples, one or more of first, second, third, and fourth rectifying devices RD1-RD4 may include one or more Schottky diodes (Schottky barrier diodes), one or more light-emitting micro diode, or a combination of one or more Schottky diodes and one or more light-emitting micro diodes. Schottky diodes and light-emitting micro diodes in first, second, third, and fourth rectifying devices RD1-RD4 may be forward serial coupling. The Schottky diode(s) may provide different rectifying or current characteristics in some applications. Different rectifying devices may have different numbers of light-emitting diodes or Schottky diodes, and the numbers of light-emitting micro diodes or Schottky diodes of first, second, third, and fourth rectifying devices RD1-RD4 may be the same or not.

In some embodiments, the total number of light-emitting micro diode(s) in first, second, third, and fourth rectifying devices RD1-RD4 may be approximately 1 to 2.5 times of the number of light-emitting micro diode(s) in fifth rectifying device RD5. In certain embodiments, the ratio may be approximately 1.5 to 2 times. In some embodiments, the effective size of the light-emitting micro diode(s) in one or more of first, second, third, and fourth rectifying devices RD1-RD4 may be approximately 0.5 to 1.5 times of the effective size of the light-emitting micro diode(s) in fifth rectifying device RD5. In certain embodiments, the ratio may be approximately 0.8 to 1.2 times.

In embodiments where Schottky diodes are used, the total number of the Schottky diode(s) in first, second, third, and fourth rectifying devices RD1-RD4 may be approximately 0.125 to 1 time of the number of light-emitting micro diode(s) in fifth rectifying device RD5. In certain embodiments, the ratio may be approximately 0.25 to 0.8 time. Additionally, when Schottky diodes are used, the effective size of the Schottky diode(s) in one or more of first, second, third, and fourth rectifying devices RD1-RD4 may be approximately 0.1 to 0.4 times of the effective size of the light-emitting micro diode(s) in the fifth rectifying device. In certain embodiments, the ratio may be approximately 0.2 to 0.3 time.

In some embodiments, one or more of first, second, third, and fourth rectifying devices RD1-RD4 may include one or more reversely-coupled Zener diode(s) for circuit protection. Additionally, the light-emitting unit 800 may include one or more capacitors or resistors coupled between first and second input terminals I1 and I2. The light-emitting system may be formed on a single substrate. Alternatively, different portions of the light-emitting unit 800 may be formed on two or more separate substrates and then combined together. For example, some or all of the rectifying devices may be formed on a second substrate, which is then mounted to a first substrate having some or all of the conductive paths formed thereon to make conductive couplings to those rectifying devices. Other devices or parts, such as Zener diodes or capacitors, if used, can be formed on one of the first substrate and the second substrate. As another example, the rectifying devices or some of their diodes may be formed on two different substrates and combined using flip-chip or wafer-bonding techniques.

The light-emitting unit illustrated above may be formed on a substrate with a bridge-circuit connection. In one embodiment, the bridge-circuit connection may have four or more circuit branches, such as branches BR1, BR2, BR3, BR4 respectively having rectifying devices RD1, RD2, RD3, or RD4 as shown in FIG. 8A, and may be provided over the substrate. Each of the branches may have two terminals. The system may have one or more light-emitting micro diodes coupled between the two terminals of each branch, as illustrated in FIG. 8A. The bridge circuit connection may be configured to receive an alternating current input from first and second power input terminal I1 and I2 to enable at a first group of the light-emitting micro diodes, such as those in the branches BR1, BR5 and BR3, to emit light during positive cycles of the alternating current input, and to enable a second group of the light-emitting micro diodes, such as those in the branches BR2, BR5, BR4 respectively having rectifying devices RD2, RD5, and RD4, to emit light during negative cycles of the alternating current input.

In one embodiment, the bridge-circuit connection may have a central branch, such as the branch BR5 having the rectifying device RD5, which may have one or more light-emitting micro diodes. Central branch BR5 with the rectifying device RD5 may be coupled between first intermediate contact O1 between a first branch BR1 with the rectifying device RD1 and a second branch BR2 with the rectifying device RD2 and second intermediate contact O2 between third branch BR3 with the rectifying device RD3 and fourth branch BR4 with the rectifying device RD4. Central branch BR5 may be configured to allow a current flow from first intermediate contact I1 to second intermediate contact I2 and to emit light in response to the current flow.

Figure 12A:
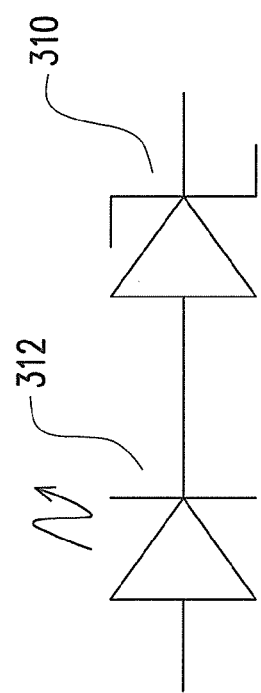
FIG. 12A illustrates an exemplary circuit diagram of a serial coupling having forwardly-coupled Zener and light-emitting micro diodes, consistent with certain disclosed embodiments.
Figure 12B:
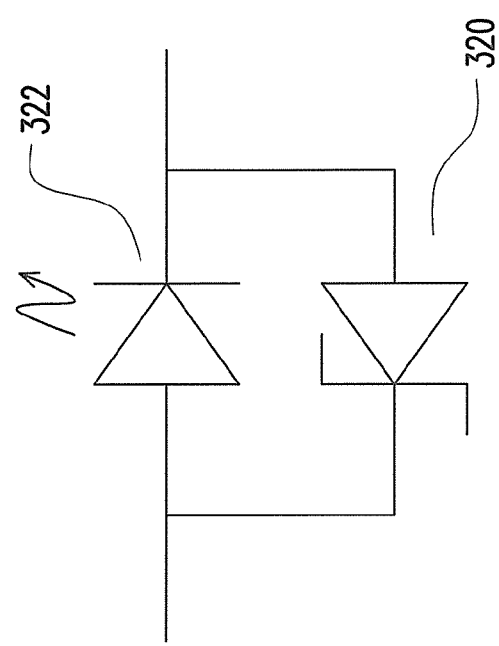
FIG. 12B illustrates an exemplary circuit diagram of a parallel coupling having reversely-coupled Zener and light-emitting micro diodes, consistent with certain disclosed embodiments.
Figure 13A:
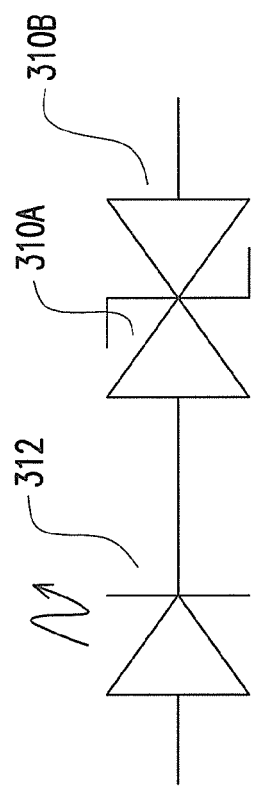
FIG. 13A illustrates an exemplary circuit diagram of a serial coupling having oppositely-coupled Zener diodes and a light-emitting micro diode, consistent with certain disclosed embodiments.
Figure 13B:
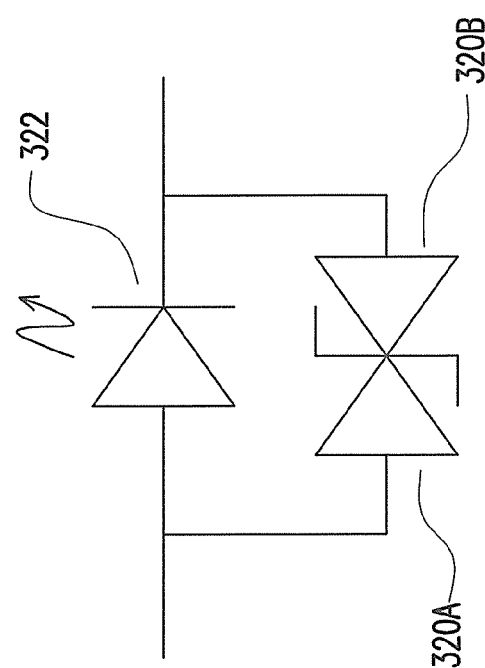
FIG. 13B illustrates an exemplary circuit diagram of a parallel coupling having oppositely-coupled Zener diodes and a light-emitting micro diode, consistent with certain disclosed embodiments.

Similar to the system illustrated above, certain relationship may exist between the total number or effective area of the light-emitting micro diode(s) in the four branches and the number or effective area of the light-emitting micro diode(s) in the central branch. In some embodiments, one or more branches illustrated in FIG. 8 may have one or more forwardly- or reversely-coupled Zener diode. The one or more Zener diodes provided in one or more of the four branches my be coupled, in a serial coupling, a parallel coupling, or both, with the light-emitting micro diodes in one or more branches. Referring to FIG. 12A, one or more Zener diodes, such as Zener diode 310, may be forwardly coupled, in a series coupling, with one or more light-emitting micro diodes, such as light-emitting micro diode 312, in one embodiment. Referring to FIG. 12B, one or more Zener diodes, such as Zener diode 320, may be reversely coupled, in a parallel coupling, with one or more light-emitting micro diodes, such as light-emitting micro diode 322, in one embodiment. In some embodiments, when multiple Zener diodes are used, two or more Zener diodes may be oppositely-coupled in series with each other. Referring to FIG. 13A, Zener diodes 310A and 310B may be oppositely-coupled in series with each other and also coupled in series with one or more light-emitting micro diodes, such as light-emitting micro diode 312, in one embodiment. Referring to FIG. 13B, Zener diodes 320A and 320B may be oppositely-coupled in series with each other and also coupled in parallel with one or more light-emitting micro diodes, such as light-emitting micro diode 322, in one embodiment.

Figure 14:
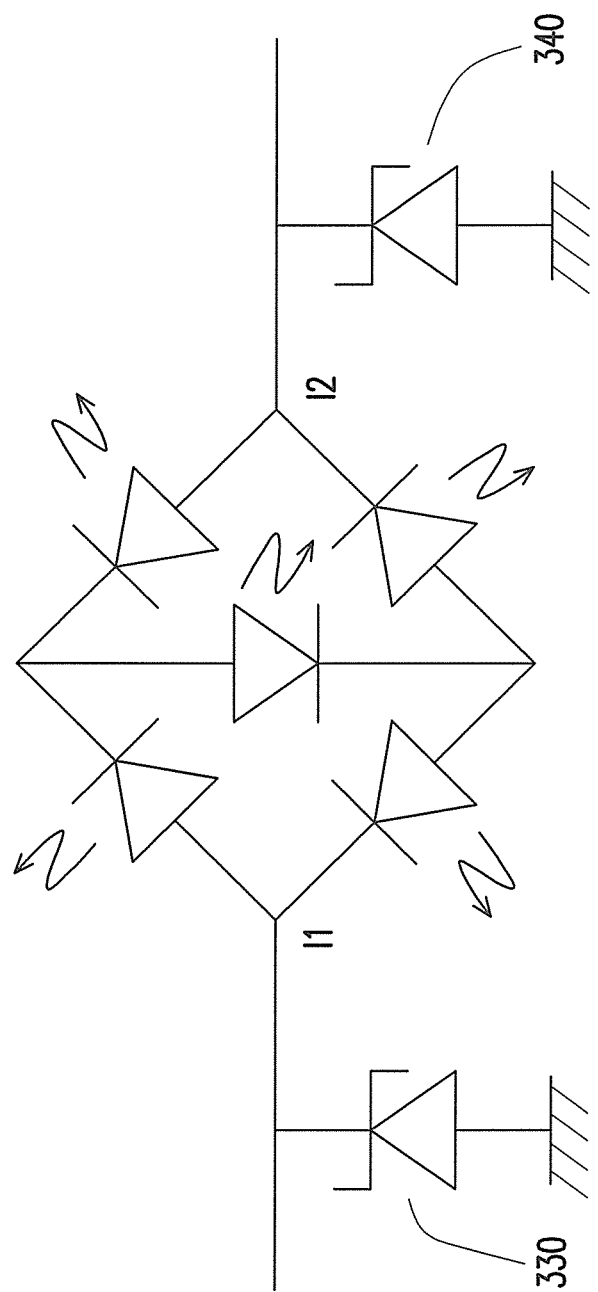
FIG. 14 illustrates an exemplary circuit diagram of a light-emitting system with Zener diodes, consistent with certain disclosed embodiments.

Referring to FIG. 14, In one embodiment, one or more Zener diodes, such as Zener diode 330, may be coupled between first power input terminal I1 and ground. Additionally, one or more Zener diodes, such as Zener diode 340, may be coupled between second power input terminal I2 and ground.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light-emitting system, comprising:
an insulating substrate; and
a plurality of light-emitting units electrically-connected on the insulating substrate, wherein each of the plurality of light-emitting units comprises a plurality of light-emitting diodes arranged as a bridge rectifier comprising:
a first part of the plurality of light-emitting diodes emitting light during positive half cycles of an AC power signal;
a second part of the plurality of light-emitting diodes emitting during negative half cycles of the AC power signal; and
a third part of the plurality of light-emitting diodes comprising at least one light-emitting diode emitting light during both the positive half cycles and the negative half cycles of the AC power signal;
wherein the plurality of light-emitting units including the plurality of light-emitting diodes arranged as a bridge rectifier is formed together in a light-emitting chip.

2. The light-emitting system of claim 1, wherein the light-emitting units are electrically connected in series.

3. The light-emitting system of claim 1, wherein the total number of the first part of the plurality of light-emitting diodes and the second part of the plurality of light-emitting diodes are approximately 1 to 2.5 times of the number of the third part of the light emitting diodes.

4. The light-emitting system of claim 1, wherein the effective size of the light emitting diodes in the first part or in the second part is approximately 0.5 to 1.5 times of the effective size of the light emitting diodes in the third part.

5. The light-emitting system of claim 1, wherein at least one of the plurality of light-emitting units comprises at least one Schottky diode.

6. The light-emitting system of claim 1, wherein at least one of the plurality of light-emitting diodes comprises more than one active layer.

7. The light-emitting system of claim 6, wherein each of the active layers of the light emitting diodes emits light of identical wavelength.

8. The light-emitting system of claim 1, wherein the plurality of light-emitting diodes in the third part comprises at least two light-emitting active layers coupled in at least one of a series connection and a parallel connection.

9. The light-emitting system of claim 8, wherein the at least two light-emitting active layers emit lights of different wavelengths.

10. A light-emitting system, comprising:
an insulating substrate; and
a plurality of light-emitting units formed on the insulating substrate, each of the plurality of light-emitting units comprising a plurality of light emitting diodes, wherein a first part and a third part of the plurality of light-emitting units are coupled to a first current path, and a second part and the third part of the plurality of light-emitting units are coupled to a second current path, thereby the plurality of light-emitting diodes in the first part and the third part and the plurality of light-emitting diodes in the second part and the third part emit light alternatively when an AC power signal is applied to the light-emitting system; wherein the plurality of light-emitting units including the plurality of light-emitting diodes arranged as a bridge rectifier is formed together in a light-emitting chip.

11. The light-emitting system of claim 10, wherein the plurality of light-emitting units are electrically connected in series.

12. The light-emitting system of claim 10, wherein the total number of the first part and the second part of the plurality of light-emitting diodes are approximately 1 to 2.5 times of the number of the third part of the plurality of light emitting diodes.

13. The light-emitting system of claim 10, wherein the effective size of the plurality of light emitting diodes in the first part or in the second part is approximately 0.5 to 1.5 times of the effective size of the plurality of light emitting diodes in the third part.

14. The light-emitting system of claim 10, wherein at least one of the plurality of light-emitting units comprises at least one Schottky diode.

15. The light-emitting system of claim 10, wherein at least one of the plurality of light-emitting diodes comprises more than one active layers.

16. The light-emitting system of claim 15, wherein each of the active layers of the at least one of the plurality of light emitting diodes emits light of identical wavelength.

17. The light-emitting system of claim 15, wherein the more than one active layers emit lights of different wavelengths.

* * * * *